(12) United States Patent  (10) Patent No.: US 7,807,990 B2
Koyama et al.  (45) Date of Patent: Oct. 5, 2010

(54) SEMICONDUCTOR DEVICE

(75) Inventors: Masato Koyama, Kanagawa-Ken (JP);
Yoshinori Tsuchiya, Yokohama (JP);
Yuuichi Kamimuta, Tsukuba (JP);
Reika Ichihara, Yokohama (JP);
Katsuyuki Sekine, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 237 days.

(21) Appl. No.: 11/753,186

(22) Filed: May 24, 2007

(65) Prior Publication Data

US 2008/0128822 A1 Jun. 5, 2008

(30) Foreign Application Priority Data

Jun. 7, 2006 (JP) ............................. 2006-158362

(51) Int. Cl.
*H01L 31/00* (2006.01)
(52) U.S. Cl. .................. 257/24; 257/204; 257/411; 257/E27.108
(58) Field of Classification Search ............. 257/369, 257/371, 372, E27.068, E21.047, 24, 204, 257/411, E21.19, 406, 410, E27.108, 407; 438/231, 197
See application file for complete search history.

(56) References Cited

U.S. PATENT DOCUMENTS

| | | | |
|---|---|---|---|
| 7,229,873 B2 * | 6/2007 | Colombo et al. | 438/231 |
| 2003/0057498 A1 * | 3/2003 | Yamashita | 257/369 |
| 2004/0043557 A1 * | 3/2004 | Haukka et al. | 438/240 |
| 2004/0135217 A1 * | 7/2004 | Yamamoto | 257/410 |
| 2004/0238904 A1 * | 12/2004 | Colombo et al. | 257/410 |
| 2005/0269635 A1 | 12/2005 | Bojarczuk, Jr. et al. | |
| 2006/0017112 A1 * | 1/2006 | Wang et al. | 257/369 |
| 2006/0131672 A1 * | 6/2006 | Wang et al. | 257/410 |
| 2006/0220157 A1 * | 10/2006 | Kalpat et al. | 257/411 |
| 2007/0045719 A1 * | 3/2007 | Wang et al. | 257/324 |

FOREIGN PATENT DOCUMENTS

JP 2006-86511 3/2006

OTHER PUBLICATIONS

Lee. High-K Gate Dielectrics. Microelectronics Research Center, ECE Department, The University of Texas at Austin, 2004.*

(Continued)

*Primary Examiner*—Lynne A Gurley
*Assistant Examiner*—Galina Yushina
(74) *Attorney, Agent, or Firm*—Oblon, Spivak, McClelland, Maier & Neustadt, L.L.P.

(57) ABSTRACT

A semiconductor device includes: a p-channel MIS transistor including: a first insulating layer formed on a semiconductor region between a source region and a drain region, and containing at least silicon and oxygen; a second insulating layer formed on the first insulating layer, and containing hafnium, silicon, oxygen, and nitrogen, and a first gate electrode formed on the second insulating layer. The first and second insulating layers have a first and second region respectively. The first and second regions are in a 0.3 nm range in the film thickness direction from an interface between the first insulating layer and the second insulating layer. Each of the first and second regions include aluminum atoms with a concentration of $1\times10^{20}$ $cm^{-3}$ or more to $1\times10^{22}$ $cm^{-3}$ or less.

20 Claims, 18 Drawing Sheets

OTHER PUBLICATIONS

Takahashi et al. Dual Workfunction Ni-Silicide/HfSiON Gate Stacks by Phase-Controlled Full-Silicidation Technique for 45 nm-node LSTP and LOP Devices. 2004, IEDM, pp. 91-94 (referenced by the applicant).*

Li et al. Dual High-k Gate Dielectrci with Poly Gate Electrode: HfSiON on nMOS and Al2O3 Capping Layer on pMOS. IEEE Electron Device Letters, vol. 26, No. 7, 2005, pp. 441-444; referenced by the applicant.*

Li et al. Dual High-k Gate dielectric with Poly Gate Electrode: HfSiON on nMOS and Al2O3 Capping Layer on pMOS. IEEe Electron Device Letters, vol. 36, No. 7, 2005, pp. 441-444.*

Takahashi et al. Dual Workfunction Ni-Silicide/HfSiON Gate Stacks by Phase-Controlled Full-Silicidation (PC-FUSI) Techniqui for 45nm-node LSTP and LOP Devices. IEEE Explore, 2004, pp. IEDM 04-91—94-IEDM 04.*

Zhu et al. Effect of Al Inclusion in HfO2 on the Physical and Electrical Properties of the Dielectrics. IEEe Electron Device Letters, vol. 23, No. 11, 2002, pp. 649-651.*

Li et al. Dual High-k Gate Dielectric With Poly Gate Electrode: HfSiON on nMOs and Al2O3 Capping layer on pMOS. IEEE Electron Device Letters, vol. 26, No &, 2005, pp. 441-444.*

Kensuke Takahashi, et al., "Dual Workfunction Ni-Silicide/HfSiON Gate Stacks by Phase-Controlled Full-Silicidation (PC-FUSI) Technique for 45nm-node LSTP and LOP Devices", IEEE International Electron Devices Meeting, IEDM Technical Digest, Sep. 13-15, 2004, pp. 91-94 and 2 cover pages.

Hong-Jyh Li, et al., "Dual High-κ Gate Dielectric With Poly Gate Electrode: HfSiON on nMOS and $Al_2O_3$ Capping Layer on pMOS", IEEE Electron Device Letters, vol. 26, No. 7, Jul. 2005, pp. 441-444.

U.S. Appl. No. 12/133,583, filed Jun. 5, 2008, Koyama, et al.

* cited by examiner

| | | GATE ELECTRODE | WORK FUNCTION | AlO DIPOLE | Al NEGATIVE CHARGES | DOPANT SEGREGATION | EFFECTIVE WORK FUNCTION |
|---|---|---|---|---|---|---|---|
| FIRST EMBODIMENT | pFET | Ni-rich SILICIDE | 4.85eV | — | +0.25V | — | 5.10eV |
| | nFET | NiSi$_2$ | 4.30eV | — | — | — | 4.30eV |
| SECOND EMBODIMENT | pFET | Ni-rich SILICIDE | 4.85eV | +0.1V | +0.25V | — | 5.20eV |
| | nFET | NiSi$_2$ | 4.30eV | — | — | — | 4.30eV |
| THIRD EMBODIMENT | pFET | p-TYPE PURE METAL | ≧4.75eV | +0.1V | +0.25V | — | ≧5.10eV |
| | nFET | n-TYPE PURE METAL | ≦4.25eV | +0.1V | +0.25V | −0.3V | ≦4.30eV |

FIG. 28

SEMICONDUCTOR DEVICE

CROSS-REFERENCE TO RELATED APPLICATION

This application is based upon and claims the benefit of priority from prior Japanese Patent Application No. 2006-158362 filed on Jun. 7, 2006 in Japan, the entire contents of which are incorporated herein by reference.

BACKGROUND OF THE INVENTION

1. Field of the Invention

The present invention relates to a semiconductor device that includes field effect transistors.

2. Related Art

"Silicon large-scale integrated circuit" is one of the fundamental device technologies that will support the advanced information society in the future. High performances through highly sophisticated functions, high-speed operations, and low power consumptions have been achieved by minimizing the size of each semiconductor element such as a CMOS (Complementary Metal Oxide Semiconductor) logic device or a flash memory. In recent years, however, it is difficult to achieve high performances by making devices smaller, due to various physical limitations.

With the gate electrodes formed with conventional silicon in CMOS logic devices, there have been problems such as the apparent existence of gate parasitic resistance due to increases in device operation speed, decreases in effective insulating film capacitance due to carrier depletion at the insulating film interfaces, and variations in threshold voltage due to penetration of added impurities into the channel region. To counter those problems, a metal gate technique has been suggested. By the metal gate technique, the conventional silicon is replaced with a heat-resistive metal material, so that the problems such as the gate parasitic resistance, capacity decreases due to depletion, and penetration of impurities can be collectively solved.

Meanwhile, a so-called full silicidation (FUSI (fully silicided gate) technique has been suggested. By the FUSI technique, a CMOS transistor is formed by a conventional silicon gate technique, and a metal gate is obtained by causing a silicon gate to chemically react with a metal and turning the silicon gate into a silicide (silicidation). Since a metal gate can be formed while the other procedures such as post oxidizing procedure remain the same as those of the conventional silicon gate technique, the FUSI technique is a very useful metal gate technique.

The FUSI technique also has an advantage in that a ±0.3 V work function shift can be caused, with the work function of a silicide being the center point, by segregating the dopant atoms at the interface between the silicide and the gate insulating film.

The gate insulating film needs to be formed with a high-k material having a higher dielectric constant than any conventional material, so as to restrain an increase in device power consumption due to an increase in leakage current. Particularly, a hafnium-based material is considered to be most useful, because of its high heat resistance and excellent electric properties.

Here, it is only natural to combine the FUSI technique and a high-k material in future products, and it has been believed that such a combination can provide CMOS logic devices with much higher performance. In reality, however, a so-called Fermi level pinning (FLP) phenomenon is caused at the FUSI/high-k interface, and the threshold voltage Vth of the transistor cannot be set at a desired low value. More specifically, where a gate insulating film containing a hafnium-based material such as HfSiON or $HfO_2$ is used, the apparent work function shifts to an energy level that has no relation with the work function of a silicide. Also, a work function shift cannot be caused by segregating the dopant atoms (as disclosed by K. Takahashi et al., in "Dual Workfunction Ni-Silicide/HfSiON Gate Stacks by Phase-Controlled Full-Silicidation (PC-FUSI) Technique for 45 nm-node LSTP and LOP Devices", 2004 IEDM, p.p. 91-94, for example).

To solve the above problems, a technique has been suggested to reduce the FLP phenomenon by adding an insulating material such as AlN or AlON to the interface between the silicide and the high-k film (see U.S. Patent Application Publication No. 2005/0269635A1, for example). This technique is effective especially for lowering the threshold voltage of a p-channel MIS transistor. Accordingly, an AlN insulating film or the like is added to a p-channel MIS transistor, so as to lower the threshold voltage by approximately 0.4 V. With this technique, however, there is a problem that the additional insulating film such as an AlN film or an AlON film reduces the gate capacitance, resulting in degradation of the transistor performance of the p-channel MIS transistor.

Also, there has been a report that an aluminum oxide added into the interface between a gate electrode and a HfSiON gate insulating film can lower the threshold voltage Vth of the p-channel MIS transistor (as disclosed by H.-J. Li and M. I. Gardner in "Dual High-k Gate Dielectric with Poly Gate Electrode: HfSiON on nMOS and $Al_2O_3$ Capping layer on pMOS", IEEE EDL, p.p. 441-444, for example). By the technique disclosed by H.-J. Li and M. I. Gardner in "Dual High-k Gate Dielectric with Poly Gate Electrode: HfSiON on nMOS and $Al_2O_3$ Capping layer on pMOS", IEEE EDL, p.p. 441-444, polysilicon is employed for the gate electrode, and the FLP phenomenon at the interface between the aluminum oxide and the polysilicon gate is utilized to lower the threshold voltage Vth of the p-channel MIS transistor. As in U.S. Patent Application Publication No. 2005/0269635A1, an aluminum oxide serving as an additional insulating film has the possibility of degrading the performance of the p-channel MIS transistor. However, according to H.-J. Li and M. I. Gardner in "Dual High-k Gate Dielectric with Poly Gate Electrode: HfSiON on nMOS and $Al_2O_3$ Capping layer on pMOS", IEEE EDL, p.p. 441-444, the physical film thickness of the HfSiON film is reduced by the amount corresponding to the amount of the added aluminum oxide, so that the total thickness of the gate insulating film cannot become larger. Because of this, the transistor performance is not degraded. However, the process of selectively reducing the film thickness of the HfSiON film is required only in the p-channel MIS transistor, which is quite difficult in practice where the actual manufacture is performed.

As described above, since the threshold voltage of a CMOS transistor that combines the FUSI technique and a gate insulating film formed with a high-k material cannot be lowered to a desired value, higher performances of CMOS logic devices, such as higher-speed operations and lower power consumptions, have been strongly hindered. It has been found that the threshold voltage Vth of a p-channel MIS transistor can be lowered by adding an insulating film such as an AlN film or an AlON film to the interface between FUSI and an Hf-based gate insulating film, so as to eliminate the FLP phenomenon at the interface that hinders the higher performances. However, the insulating film at the interface reduces the gate insulating capacitance, resulting in degradation of the transistor performance. To counter this problem, there has been the technique of reducing the film thickness of the Hf-based gate insulating film by the amount corresponding to the amount of the Al-based oxide. However, this technique complicates the production process, and cannot be put into practical use.

SUMMARY OF THE INVENTION

The present invention has been made in view of these circumstances, and an object thereof is to provide a semiconductor device including a MIS transistor having a stacked structure formed with a metal gate with an appropriate threshold voltage Vth and a gate insulating film made of a hafnium-based high-k material.

A semiconductor device according to a first aspect of the present invention includes: a substrate: a p-channel MIS transistor including: an n-type semiconductor region formed on the substrate; a p-type source region and a p-type drain region formed to face each other in the n-type semiconductor region; a first insulating layer formed on the n-type semiconductor region between the p-type source region and the p-type drain region, and containing silicon and oxygen, the first insulating layer having a first region; a second insulating layer formed on the first insulating layer, and containing hafnium, silicon, oxygen, and nitrogen, the second insulating layer having a second region, the second region being in a 0.3 nm range in the film thickness direction from the interface between the first insulating layer and the second insulating layer, the first region being in a 0.3 nm range in the film thickness direction from an interface between the first insulating layer and the second insulating layer, and each of the first and second regions including aluminum atoms with a concentration of $1 \times 10^{20}$ cm$^{-3}$ or more to $1 \times 10^{22}$ cm$^{-3}$ or less; and a first gate electrode formed above the second insulating layer, and an n-channel MIS transistor including: a p-type semiconductor region formed on the substrate and insulated from the n-type semiconductor region; an n-type source region and an n-type drain region formed to face each other in the p-type semiconductor region; a third insulating layer formed on the p-type semiconductor region between the n-type source region and n-type drain region, and containing silicon and oxygen; a fourth insulating layer formed on the third insulating layer, and containing hafnium, silicon, oxygen, and nitrogen; and a second gate electrode formed above the fourth insulating layer.

A semiconductor device according to a second aspect of the present invention includes: a substrate: a p-channel MIS transistor including: an n-type semiconductor region formed on the substrate; a p-type source region and a p-type drain region formed to face each other in the n-type semiconductor region; a first insulating layer formed on the n-type semiconductor region between the p-type source region and the p-type drain region, and containing silicon and oxygen, the first insulating layer having a first region; a second insulating layer formed on the first insulating layer, and containing hafnium, silicon, oxygen, and nitrogen, the second insulating layer having a second and third regions, the second region being in a 0.3 nm range in the film thickness direction from the interface between the first insulating layer and the second insulating layer, the first region being in a 0.3 nm range in the film thickness direction from an interface between the first insulating layer and the second insulating layer, and each of the first and second regions including aluminum atoms with a concentration of $1 \times 10^{20}$ cm$^{-3}$ or more to $1 \times 10^{22}$ cm$^{-3}$ or less; a third insulating layer formed on the second insulating layer, and containing aluminum and oxygen, the third insulating layer having a fourth region, the fourth region being in a 0.3 nm range in the film thickness direction from the interface between the second insulating layer and the third insulating layer, the third region being in a 0.3 nm range in the film thickness direction from an interface between the second insulating layer and the third insulating layer, and each of the third and fourth regions including aluminum atoms with a concentration of $1 \times 10^{22}$ cm$^{-3}$ or more to $3 \times 10^{22}$ cm$^{-3}$ or less; and a first gate electrode formed above the third insulating layer, and an n-channel MIS transistor including: a p-type semiconductor region formed on the substrate and insulated from the n-type semiconductor region; an n-type source region and an n-type drain region formed to face each other in the p-type semiconductor region; a fourth insulating layer formed on the p-type semiconductor region between the n-type source region and the n-type drain region, and containing silicon and oxygen; a fifth insulating layer formed on the fourth insulating layer, and containing hafnium, silicon, oxygen, and nitrogen; and a second gate electrode formed above the fifth insulating layer.

A semiconductor device according to a third aspect of the present invention includes: a substrate: a p-channel MIS transistor including: an n-type semiconductor region formed on the substrate; a p-type source region and a p-type drain region formed to face each other in the n-type semiconductor region; a first insulating layer formed on the n-type semiconductor region between the p-type source region and the p-type drain region, and containing silicon and oxygen, the first insulating layer having a first region; a second insulating layer formed on the first insulating layer, and containing hafnium, silicon, oxygen, and nitrogen, the second insulating layer having a second and third regions, the second region being in a 0.3 nm range in the film thickness direction from the interface between the first insulating layer and the second insulating layer, the first region being in a 0.3 nm range in the film thickness direction from an interface between the first insulating layer and the second insulating layer, and each of the first and second regions including aluminum atoms with a concentration of $1 \times 10^{20}$ cm$^{-3}$ or more to $1 \times 10^{22}$ cm$^{-3}$ or less; a third insulating layer formed on the second insulating layer, and containing aluminum and oxygen, the third insulating layer having a fourth region, the fourth region being in a 0.3 nm range in the film thickness direction from the interface between the second insulating layer and the third insulating layer, the third region being in a 0.3 nm range in the film thickness direction from an interface between the second insulating layer and the third insulating layer, and each of the third and fourth regions including aluminum atoms with a concentration of $\times 10^{22}$ cm$^{-3}$ or more to $3 \times 10^{22}$ cm$^{-3}$ or less; and a first gate electrode formed above the third insulating layer, and an n-channel MIS transistor including: a p-type semiconductor region formed on the substrate and insulated from the n-type semiconductor region; an n-type source region and an n-type drain region formed to face each other in the p-type semiconductor region; a fourth insulating layer formed on the p-type semiconductor region between the n-type source region and the n-type drain region, and containing silicon and oxygen the fourth insulating layer having a fifth region; a fifth insulating layer formed on the fourth insulating layer, and containing hafnium, silicon, oxygen, and nitrogen, the fifth insulating layer having a sixth and seventh regions, the sixth region being in a 0.3 nm range in the film thickness direction from the interface between the fourth insulating layer and the fifth insulating layer, the fifth region being in a 0.3 nm range in the film thickness direction from an interface between the fourth insulating layer and the fifth insulating layer, and each of the fifth and sixth regions including aluminum atoms with a concentration of $1 \times 10^{20}$ cm$^{-3}$ or more to $1 \times 10^{22}$ cm$^{-3}$ or less; a sixth insulating layer formed on the fifth insulating layer, and containing aluminum and oxygen, the sixth insulating layer having an eighth region, the eighth region being in a 0.3 nm range in the film thickness direction from the interface between the fifth insulating layer and the sixth insulating layer, the seventh region being in a 0.3 nm range in the film thickness direction from an interface between the fifth insulating layer and the sixth insulating layer, and each of the seventh and eighth regions including aluminum atoms with a concentration of $1\times10^{22}$ cm$^{-3}$ or more to $3\times10^{22}$ cm$^{-3}$ or less; and a second gate electrode formed above the sixth insulating layer.

BRIEF DESCRIPTION OF THE DRAWINGS

FIG. 28 shows the effective work functions obtained in the respective embodiments, and their contributions in detail;

DETAILED DESCRIPTION OF THE INVENTION

Figure 1:
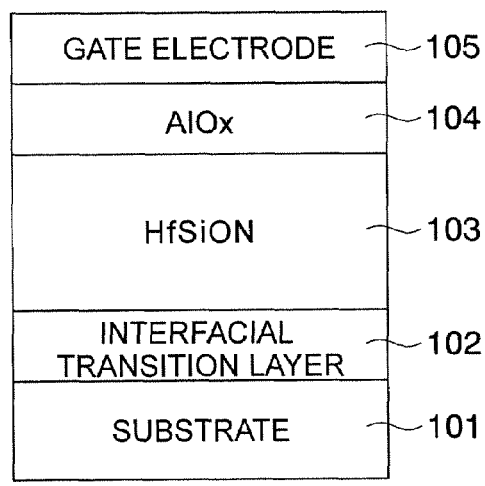
FIG. 1 is a schematic cross-sectional view showing a MIS capacitor used in one embodiment of the present invention.

The following is a description of embodiments of the present invention, with reference to the accompanying drawings. In the following embodiments, same components are denoted by same reference numerals, and repeated explanation of them will be avoided. Each of the drawings is a schematic view for illustrating the invention and facilitating understanding of the invention. The shapes, sizes, and ratios shown in the drawings might be different from those by the actual measurement, and can be arbitrarily changed, with the following description and the known techniques being taken into account.

In each of the following embodiments, a CMOS transistor will be described. However, the present invention can also be applied to memories and logic circuits having integrated semiconductor elements as described above, and system LSIs and the likes each having those memories or circuits mounted on one chip.

(Outlines and Principles)

Before the embodiments of the present invention are described, the principles of the present invention are described, with reference to FIG. 1 through 8.

We made an intensive study on the mechanism of lowering the threshold voltage Vth of a p-channel MIS transistor by adding an Al-based insulating film to the interface between a gate electrode and an insulating film made of a high-k material (the interface being hereinafter referred to as the upper interface), which was reported in a document of a conventional technique. As a result, we found that such an Al-based insulating film has the two effects: 1) stabilizing the upper interface (eliminating the FLP phenomenon); and 2) diffusing Al in the Hf-based gate insulating film so that Al reaches the vicinity of the interface between the gate insulating film and the Si substrate (the interface being hereinafter referred to as the lower interface), so as to form charges. Even if the Al-based insulating film does not remain as a continuous layer at the upper interface, the threshold voltage Vth can be lowered by a certain amount by distributing Al into the lower interface. The present invention greatly differs from the conventional technique in that the threshold voltage Vth can be lowered simply by distributing Al into the lower interface, without a decrease in gate capacitance due to the Al-based insulating film, which is the problem with the conventional technique.

In the following, the results of tests conducted to examine the effects of an AlOx layer in a stacked structure formed with a poly Si gate, the AlOx layer, and a HfSiON insulating film are described in detail.

FIG. 1 is a cross-sectional view schematically showing the MIS capacitor structure on which we conducted the tests. An interfacial transition layer 102 having silicon and oxygen as bases is placed on a silicon substrate 101, and a HfSiON film 103 is placed on the interfacial transition layer 102. An AlOx film 104 is further placed on the HfSiON film 103, and a gate electrode 105 made of p$^+$-polysilicon is placed on the AlOx film 104. In this specification, "AlOx" means $Al_2O_3$ or $AlO_x$ (0<x<1.5).

Figure 2:
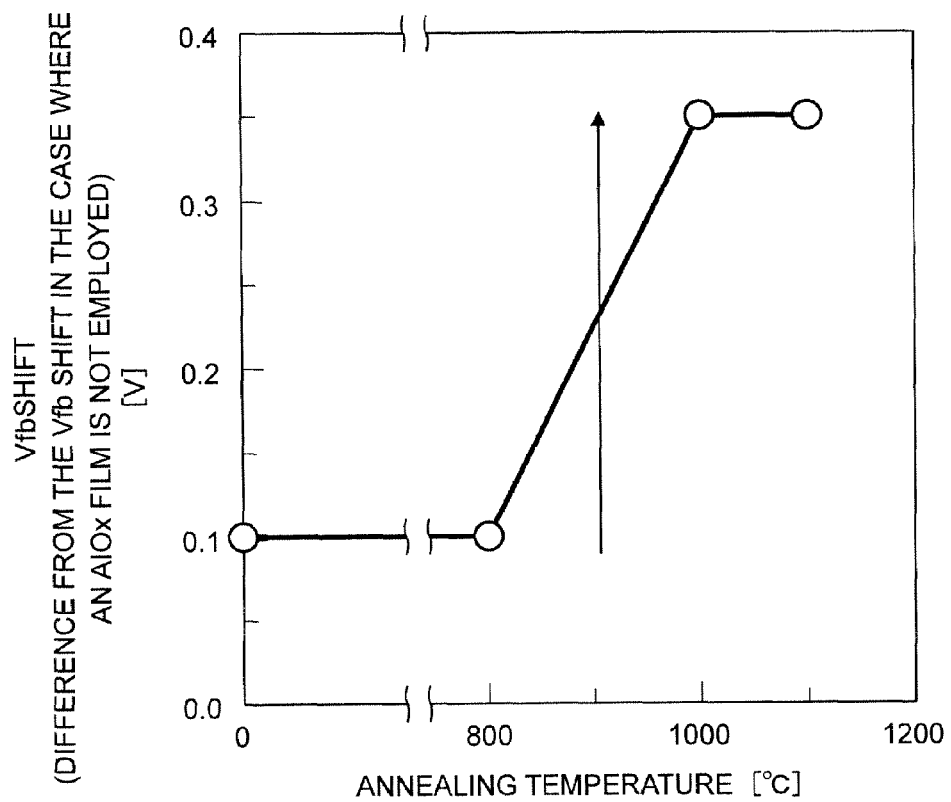
FIG. 2 shows the critical changes in flat-band voltage (Vfb) with respect to heat treatment temperature when the capacitor structure of FIG. 1 is subjected to heat treatment.

FIG. 2 is a graph showing the relationship between the flat-band voltage Vfb and the heat treatment temperature in the structure shown in FIG. 1. The flat-band voltage Vfb indicated by the ordinate axis in FIG. 2 represents the difference between the flat-band voltage of the structure having the AlOx film 104 shown in FIG. 1 and the flat-band voltage of a structure not having the AlOx film 104. Where the heat treatment temperature is 800° C. or lower, the positive shift of the flat-band voltage Vfb due to the addition of the AlOx film 104 is approximately 0.1 V, and a change is not observed with the variation in heat treatment temperature. Where the heat treatment temperature is 1000° C. or higher, the flat-band voltage Vfb shifts critically in the positive direction by approximately 0.35 V.

Figure 3:
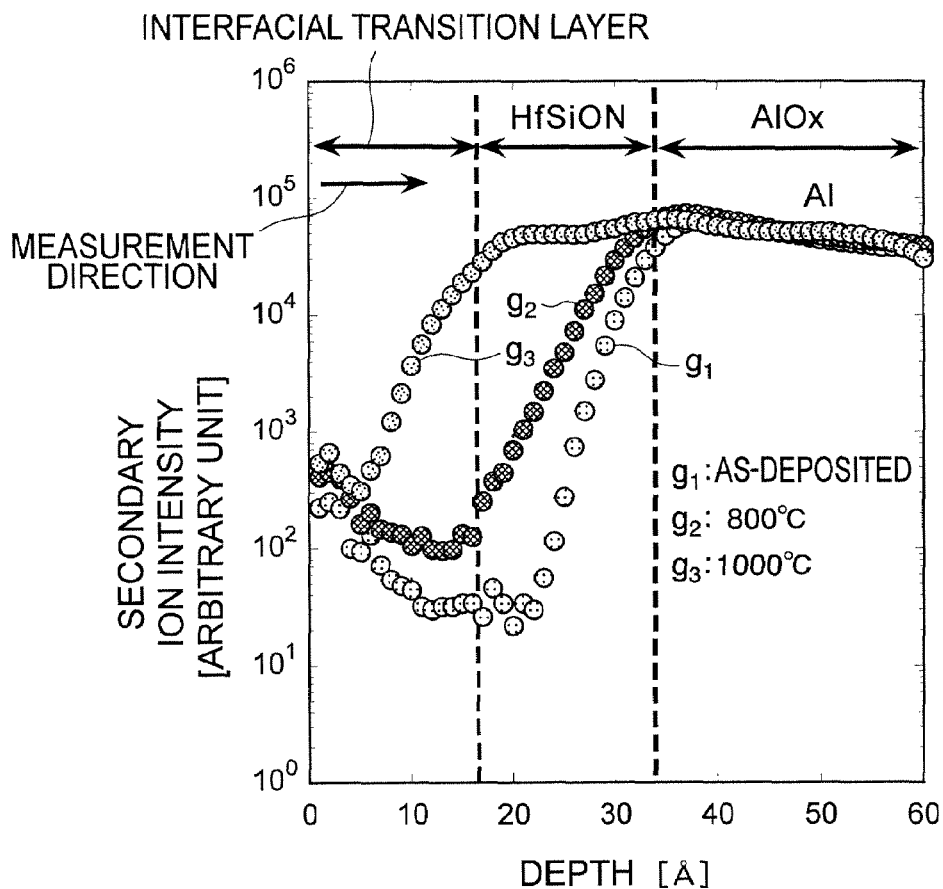
FIG. 3 shows the results of tests conducted to examine the changes in atomic geometry in the gate stacked structure in accordance with the test results shown in FIG. 2.

FIG. 3 shows the results of SIMS (Secondary Ion Mass Spectroscopy) tests conducted to examine the Al element distribution in the stacked structure shown in FIG. 1 and to determine the cause of the critical shift of the flat-band voltage Vfb in the positive direction where the heat treatment temperature was in the range of 800° C. to 1000° C. as shown in FIG. 2. In FIG. 3, graph $g_1$ shows the Al element distribution before the AlOx film was deposited and subjected to heat treatment, graph $g_2$ shows the Al element distribution after the AlOx film was deposited and subjected to heat treatment at 800° C., and graph $g_3$ shows the Al element distribution after the AlOx film was deposited and subjected to heat treatment at 1000° C. As can be seen from the test results, the Al element diffusion occurred from the AlOx film toward the HfSiON film due to the heat treatment, and the diffusion activity was more remarkable at a higher heat treatment temperature. Particularly, where the heat treatment was carried out at 1000° C., and a critical positive shift of the flat-band voltage Vfb was obtained, a considerable amount of Al reached the interfacial transition layer.

Figure 4:
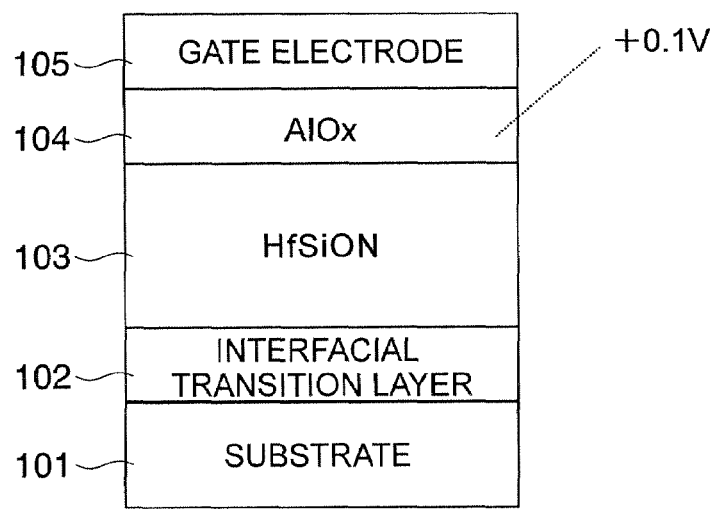
FIG. 4 is a schematic view showing the cause of a Vfb shift obtained when the heat treatment temperature shown in FIG. 2 is 800 or lower.

FIG. 4 schematically shows the gate stacked structure that was observed where the heat treatment was carried out at 800° C. or lower as in the graph of the variation in flat-band voltage Vfb shown in FIG. 2. Compared with a case without an AlOx film, the flat-band voltage Vfb shifted in the positive direction by approximately 0.1 V. This shift is considered to be a shift of the flat-band voltage Vfb caused by the AlOx film 104 stabilizing the interface between the gate electrode 105 and the HfSiON film 103.

Figure 5:
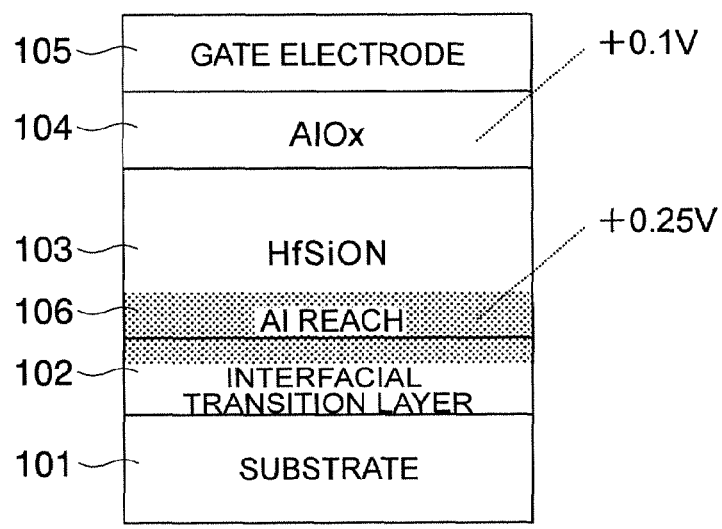
FIG. 5 is a schematic view showing the cause of a Vfb shift obtained when the heat treatment temperature shown in FIG. 2 is 1000° C. or higher.

FIG. 5 schematically shows the portion related to the Vfb shift in the gate stacked structure where the heat treatment was carried out at 1000° C. or higher as in the graph of the variation in flat-band voltage Vfb shown in FIG. 2. The shift (0.1 V) of the flat-band voltage Vfb due to the addition of the AlOx film 104 still exists. In addition to that, more than a predetermined amount of Al atoms 106 reach the interfacial transition layer 102 at 1000° C. or higher. It is assumed that the Al atoms cause a further positive shift (0.25 V) of the flat-band voltage Vfb.

The shift of the flat-band voltage Vfb caused by the Al atoms having reached the interfacial transition layer 102 is considered to be due to the effect of the negative fixed charges formed by the Al atoms. At the same time, this is the critical effect obtained when the amount of Al is equal to or larger than a predetermined value. To sum up this phenomenon on the basis of the test results shown in FIG. 3, where the Al concentration in the vicinity of the interface between the HfSiON film 103 and the interfacial transition layer 102 is approximately $5 \times 10^{19}$ cm$^{-3}$ (heat treatment at 800° C.), the Al concentration is equal to or lower than the critical value for a large Vfb shift, but, where the Al concentration is approximately $1 \times 10^{22}$ cm$^{-3}$ (heat treatment at 1000° C.), the Al concentration is higher than the critical value. Those Al concentration values were obtained, with the ordinate axis of FIG. 3 being the absolute concentration. The critical point did not become clear through the experiments, but the logical critical point is estimated to be an Al concentration of approximately $1 \times 10^{20}$ cm$^{-3}$. This is because the shift of the flat-band voltage Vfb beyond the critical point is 0.2 V to 0.3 V as shown in FIG. 2, and the lowest possible charge density required to cause such a shift of the flat-band voltage Vfb is estimated to be approximately $1 \times 10^{20}$ cm$^{-3}$.

The interfacial transition layer 102 interposed between the silicon substrate 101 and the HfSiON film 103 should preferably be formed with an insulating material containing at least silicon and oxygen. This is because, when Al is added into the interface between the HfSiON film 103 and the interfacial transition layer 102 formed with such an insulating material, a defect of some kind is formed, and this defect serves as negative charges. Also, the interfacial transition layer 102 stabilizes the properties of the interface with the substrate 101, and contributes to the higher operation speed and higher long-term reliability of the transistor.

As described above, in one embodiment of the present invention, high-temperature heat treatment needs to be carried out at 1000° C. or higher, so as to diffuse Al through the HfSiON film 103. At such a high temperature, however, the HfSiON film 103 is separated into the HfO$_2$ phase and the SiO$_2$ phase, and HfO$_2$ might crystallize. In such a case, so-called grain boundaries are formed around the HfO$_2$ crystal grains, and the grain boundaries form a high-speed diffusion path for Al. Since the grain boundaries of the HfO$_2$ crystals exist at random, the Al diffusion also occurs in a two-dimensionally uneven fashion. This causes variations in threshold voltage Vth among devices. Therefore, to eliminate the variations in the shift of the flat-band voltage Vfb with the Al diffusion among devices in one embodiment of the present invention, the HfSiON film 103 cannot be separated into phases and cannot crystallize at the diffusion temperature.

To satisfy such demands on the HfSiON film 103, the nitrogen concentration in the HfSiON film 103 should preferably be 5 atomic % or higher. If the nitrogen concentration is lower than that, the HfSiON film 103 is separated into phases and crystallize, regardless of the Hf concentration. The highest possible nitrogen concentration is 57 atomic %, as the HfSiON film 103 might have a structure of $(HfO_2)_x(Hf_3N_4)_y(SiO_2)_z(Si_3N_4)_{1-X-Y-Z}$. In reality, however, an insulating film with the highest performance in terms of long-term reliability can be obtained when the nitrogen concentration in the HfSiON film 103 is 20 atomic % or lower.

Figure 6:
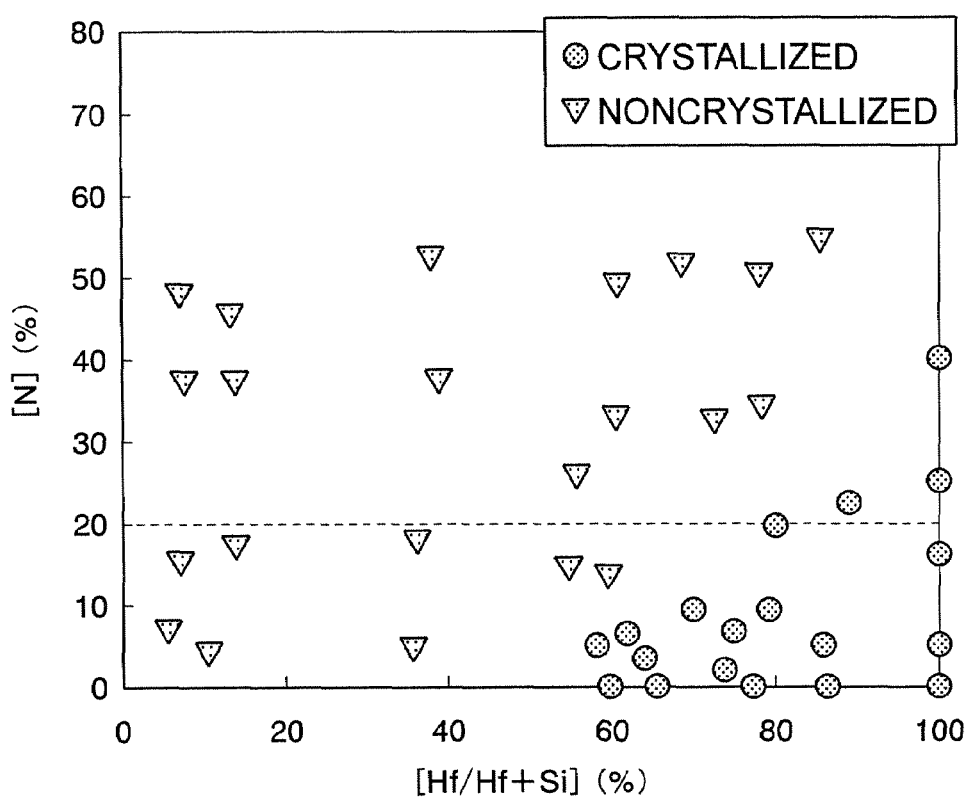
FIG. 6 shows the results of tests conducted to examine the composition dependence of the HfSiON crystallization activities.
Figure 7:
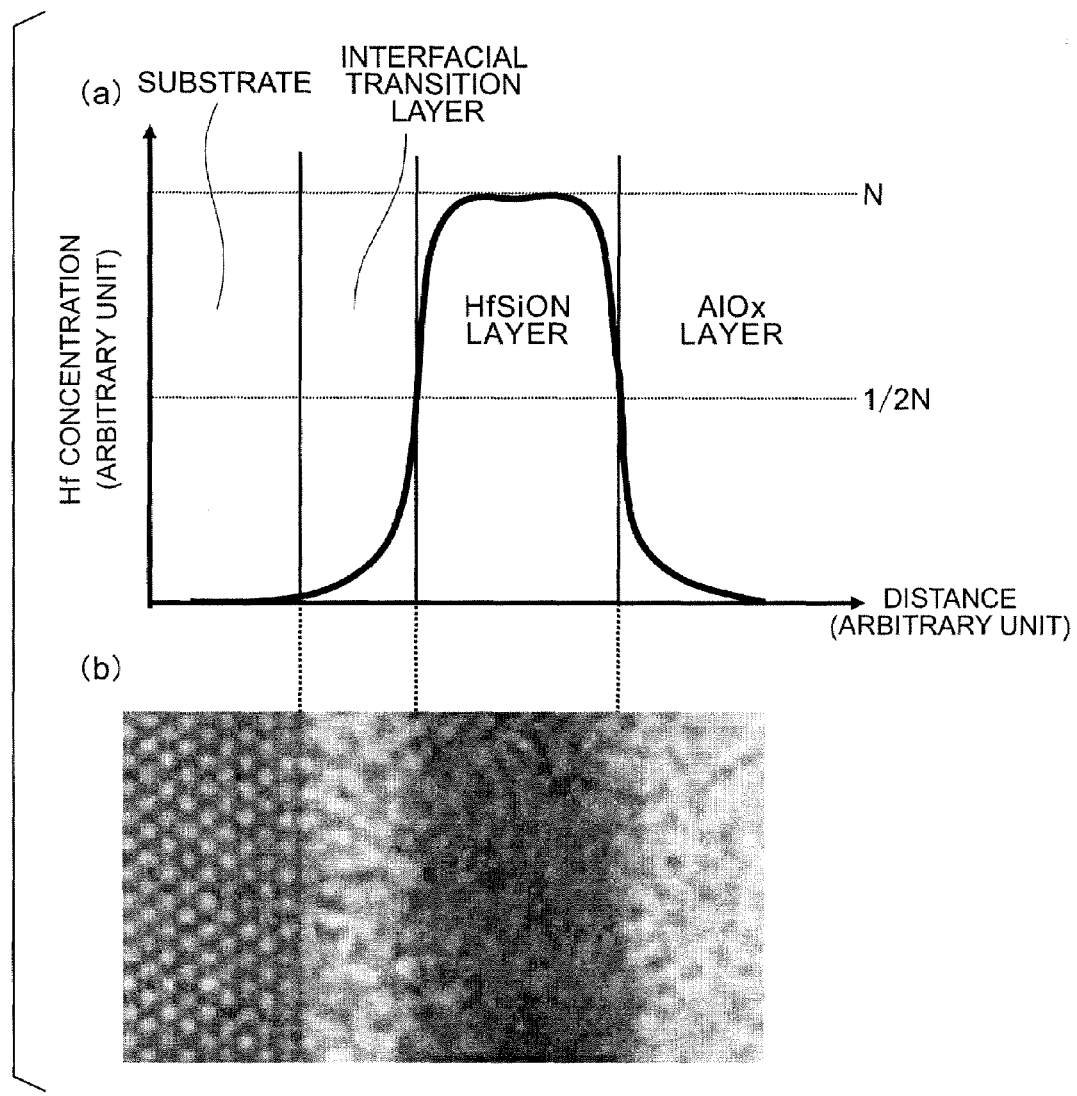
FIGS. 7(a) and 7(b) illustrate the definitions of interfaces between stack gate insulating films in one embodiment of the present invention.

As the nitrogen concentration in the HfSiON film 103 is required to be 20 atomic % or lower, the composition ratio (=Hf/(Hf+Si)) of Hf to (Hf+Si) is preferably lower than 80%. FIG. 6 shows the results of XRD (X-ray Diffractometry) tests conducted by the inventors to examine the mutual relations between the composition of the HfSiON film and the crystallizing activities during the heat treatment (at 1000° C.), so as to determine the composition limit. As can be seen from FIG. 6, to maintain an noncrystalline state in the HfSiON film, the nitrogen concentration needs to become higher as the ratio (=Hf/(Hf+Si)) becomes higher. According to FIG. 6, HfSiON crystallizes, if the ratio (=Hf/(Hf+Si)) is 80% when the nitrogen concentration is 20 atomic %. Therefore, the ratio (=Hf/(Hf+Si)) is preferably lower than 80% in one embodiment of the present invention. Where the upper limit of the ratio (=Hf/(Hf+Si)) is set at a point that is actually obtained through data, the effects of one embodiment of the present invention can be achieved with certainty, as long as the ratio of a confirmed noncrystalline state is 60% or lower even with a nitrogen concentration of 15 atomic %. With the nitrogen concentration being set at 20 atomic %, the critical value that is the highest possible ratio (=Hf/(Hf+Si)) with which a noncrystalline state can be maintained cannot be quantitatively defined, because of insufficient data. However, the critical value definitely exists at some point in the range of 60% to less than 80%. With the test results being interpolated, the Hf ratio with which a noncrystalline state can be maintained even with a nitrogen concentration of 20 atomic % or at 1000° C. is determined to be approximately 70%.

If the ratio (=Hf/(Hf+Si)) is lower than 25%, the relative permittivity is as low as 8, and a sufficient decrease in leakage current cannot be achieved for the gate insulating film formed with conventional $SiO_2$. Therefore, the ratio (=Hf/(Hf+Si)) in one embodiment of the present invention needs to be 25% or higher. More preferably, the ratio (=Hf/(Hf+Si) should be 50% or higher, so that the relative permittivity can be increased to 12 or higher.

In one embodiment of the present invention, the gate insulating film needs to maintain a crystalline state even at 1000° C., which is a required temperature for diffusing Al atoms. Therefore, even if a high-k insulating film other than a HfSiON film is employed, the effects of the one embodiment of the present invention cannot be expected.

The respective interfaces among the interfacial transition layer 102, the HfSiON film 103, and the AlOx film 104 in one embodiment of the present invention are defined as the points where the Hf concentration becomes a half of the value observed at the center of the HfSiON film 103 (see FIG. 7(a)). Although those definitions are made merely for descriptive purposes, the defined interfaces substantially correspond to the changes in contrast in a cross-section observed by TEM (Transmission Electron Microscopy) as shown in FIG. 7(b). Accordingly, the above interface definitions can be considered to be objective definitions.

The thickness of the interfacial transition layer 102 should preferably be in the range of 0.3 nm to 0.8 nm. If the interfacial transition layer 102 is thinner than 0.3 nm, the operation speed of the transistor decreases due to the influence of the charges in the HfSiON film 103. If the interfacial transition layer 102 is thicker than 0.8 nm, the film thickness properties required for the gate insulating film of a future CMOS transistor cannot be achieved.

The thickness of the HfSiON film 103 should preferably be in the range of 1 nm to 3 nm. If the HfSiON film 103 is thinner than 1 nm, the variation in thickness in the two-dimensional direction of the gate insulating film becomes wider. This results not only in variations in device performances in the wafer plane, but also in a decrease in the proportion of the high relative permittivity portion in the gate insulating film including the interfacial transition layer 102 and the AlOx film 104. Because of this, a sufficient decrease in leakage current cannot be achieved. If the HfSiON film 103 is thicker than 3 nm, the film thickness properties required for the gate insulating film of a future CMOS transistor cannot be achieved.

The concentration of Al that causes the flat-band voltage Vfb in the vicinity of the interface (or in a region including the interface) between the interfacial transition layer 102 and the HfSiON film 103 should preferably be in the range of $1\times10^{20}$ $cm^{-3}$ to $1\times10^{22}$ $cm^{-3}$ in a 0.3 nm region in the thickness direction from the interface on the side of the interfacial transition layer 102 and in a 0.3 nm region in the thickness direction from the interface on the side of the HfSiON film 103. This is because the existence of Al in those regions leads to the formation of negative fixed charges. If the Al concentration is equal to or higher than $1\times10^{20}$ $cm^{-3}$, the effect of forming fixed critical charges is achieved, and the flat-band voltage Vfb is shifted in the positive direction. If the Al concentration in those regions is higher than $1\times10^{22}$ $cm^{-3}$, the Al concentration in the HfSiON film 103 is also higher than $1\times10^{22}$ $cm^{-3}$, and the Al composition ratio in the HfSiON film 103 is as high as 20 atomic % or higher. Since the relative permittivity of HfSiON becomes lower due to the addition of Al, a desired thinner gate insulating film cannot be obtained.

One embodiment of the present invention is characterized in that Al is distributed in the vicinity of the interface (or in a region including the interface) between the interfacial transition layer and the HfSiON film, as described above. It is preferred that an Al insulating film does not exist at the interface between the gate electrode and the HfSiON film, so as to increase the gate capacitance. A method for forming such a structure will be described later in greater detail in the description of the first embodiment of the present invention.

Figure 8:
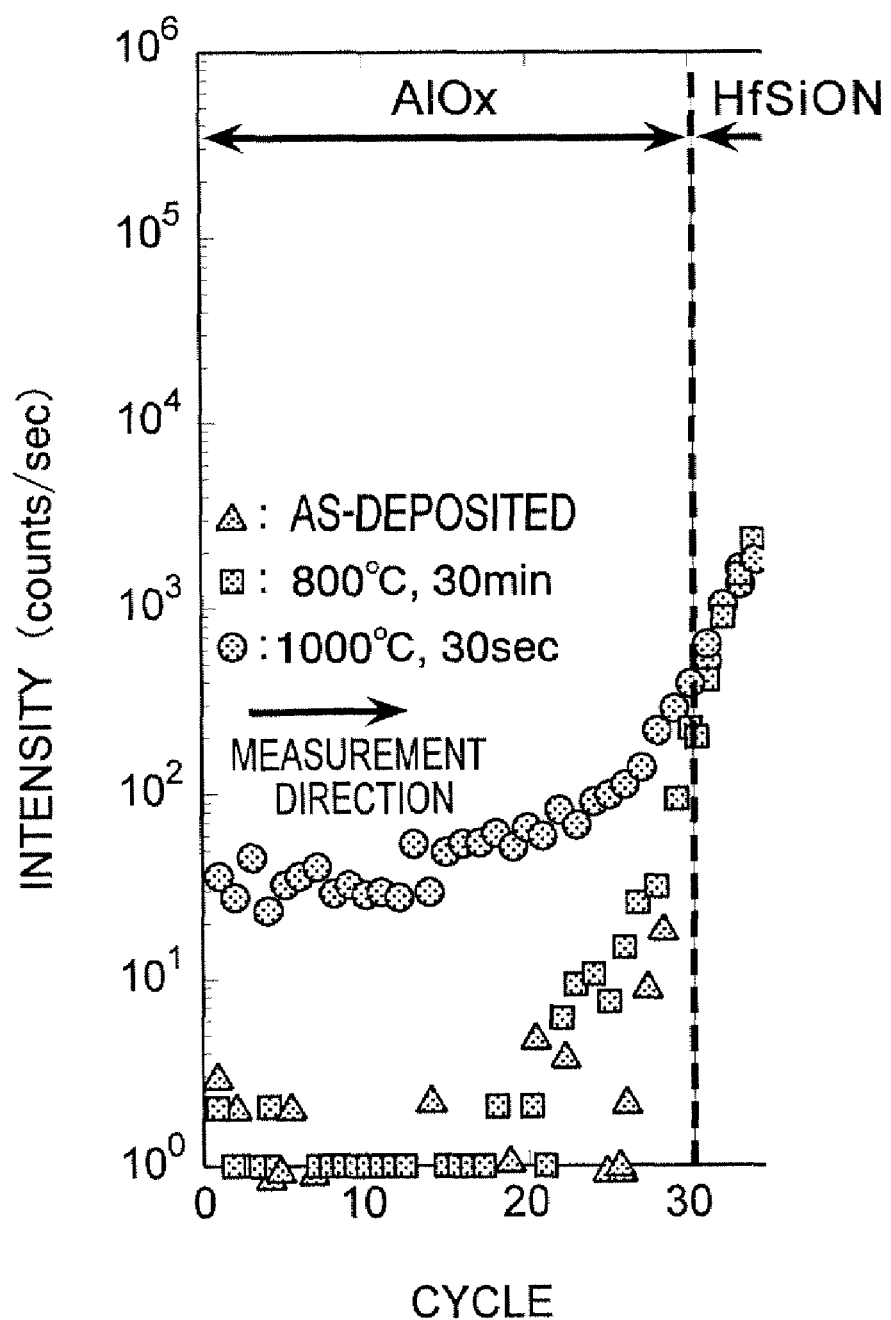
FIG. 8 shows the results of tests conducted to examine the temperature dependence of Hf diffusion from the HfSiON film into the AlOx film.

In one embodiment of the present invention, on the other hand, an aluminum oxide is placed at the interface between the gate electrode and the HfSiON film, and is subjected to heat treatment. By doing so, Al is distributed in the vicinity of the interface (or in a region including the interface) between the interfacial transition layer and the HfSiON film. In such a case, it is possible to achieve both a positive shift of the flat-band voltage Vfb by virtue of the stabilization of the interface between the gate electrode and the HfSiON film, and a shift of the flat-band voltage Vfb by virtue of the Al in the vicinity of the interface between the interfacial transition layer and the HfSiON film (see FIG. 5). Accordingly, a large decrease in threshold voltage Vth can be achieved in the one embodiment of the present invention. Although a decrease in gate capacitance is caused by the addition of an aluminum oxide by the conventional technique, there is no need to worry about such a problem in the one embodiment of the present invention. FIG. 8 shows the results of SIMS tests conducted to examine the Hf diffusion activities toward the AlOx film 104 at the interface between the AlOx film 104 and the HfSiON film 103. Where the heat treatment temperature is equal to or lower than 800° C., Hf diffusion into the AlOx film is not observed. Where the heat treatment temperature is 1000° C., the Hf of the HfSiON film is thermally diffused into the AlOx film, as is apparent from FIG. 8. The diffusion amount depends on the heat treatment conditions. According to the test results shown in FIG. 8, the diffusion amount in the vicinity of the interface with the HfSiON film is approximately $3\times10^{22}$ $cm^{-3}$, and the diffusion amount at a point 2 nm away from the interface is approximately $1\times10^{22}$ $cm^{-3}$. Where a large amount of Hf exists in the AlOx film, the relative permittivity of the AlOx film, which is originally 10, is increased to 20. Accordingly, a thinner gate insulating film can be obtained.

Figure 29:
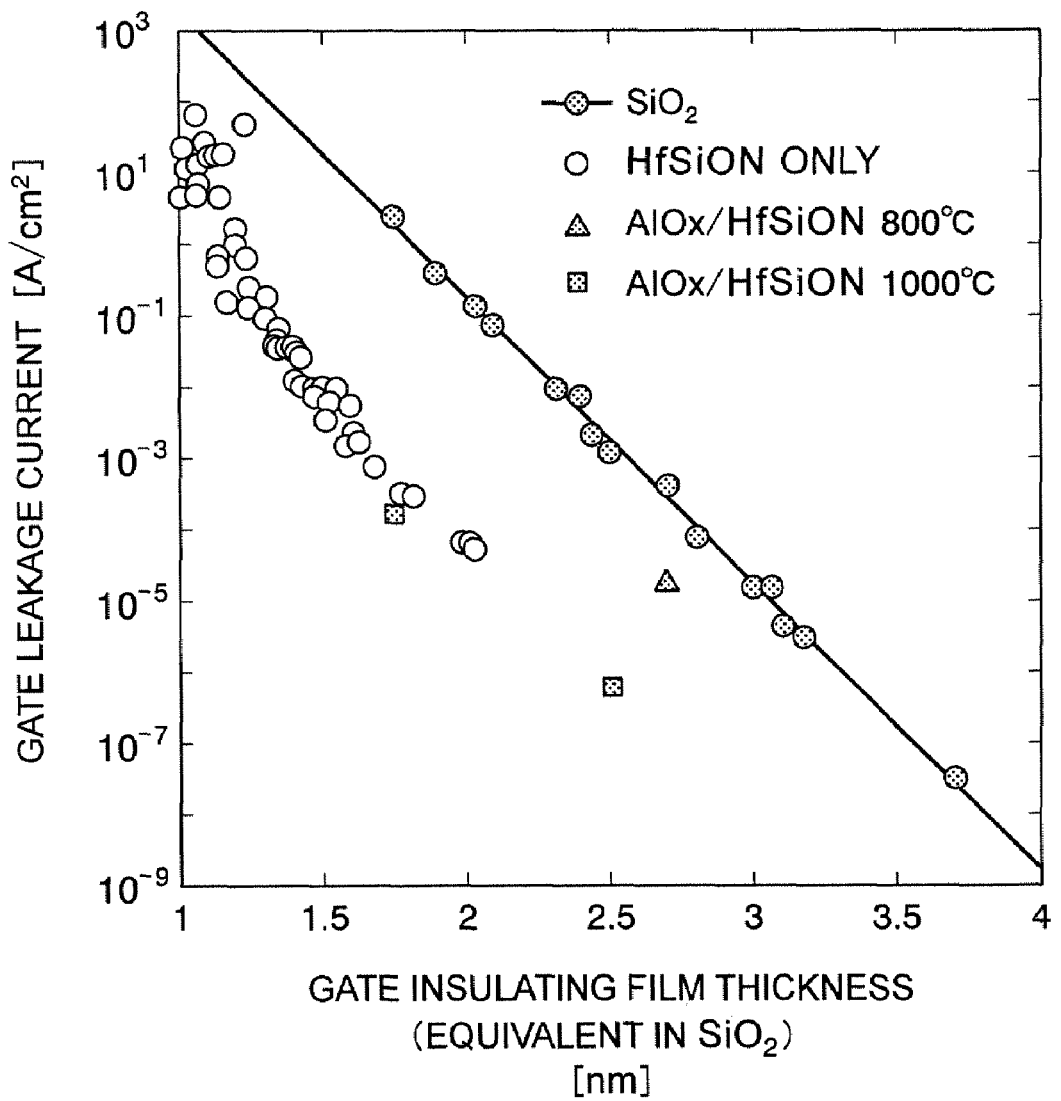
FIG. 29 shows the film thickness dependence of the gate insulating film having gate leakage current in a semiconductor device according to one embodiment of the present invention.

In a structure in which an AlOx film is formed on a HfSiON film and is subjected to heat treatment at 1000° C. in accordance with one embodiment of the present invention, the trend between the gate insulating film thickness (equivalent in $SiO_2$) and the gate leakage current observed in the case of HfSiON without AlOx is substantially maintained, as shown in FIG. 29. This reflects the fact that the AlOx film becomes a high-dielectric film by virtue of the large amount of Hf diffusion. Originally, the relative permittivity of the AlOx film in which Hf is diffused might be higher than the relative permittivity of the HfSiON film. Accordingly, the leakage current was predicted to be smaller than that in the case of a single HfSiON film. This is considered to be the problem with the process caused by AlOx film that is not optimized, instead of a problem in principle. In a structure in which an AlOx film is formed on the HfSiOn film and is subjected to heat treatment at 800° C., as conducted by the inventors, the trend between the gate insulating film thickness and the minus gate leakage current becomes much less clearer than in the case of HfSiON without AlOx, as shown in FIG. 29. This is considered to be a result of the addition of AlOx with a low dielectric constant onto HfSiON with a high dielectric constant.

Figure 30:
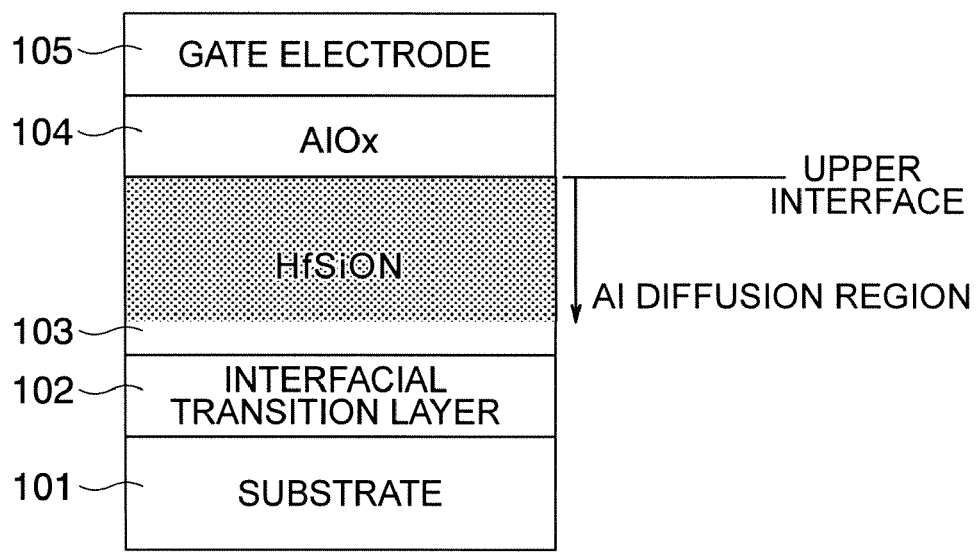
FIG. 30 is a cross-sectional view showing the Al diffusion in a semiconductor device according to one embodiment of the present invention, where annealing is performed at 800° C.
Figure 31:
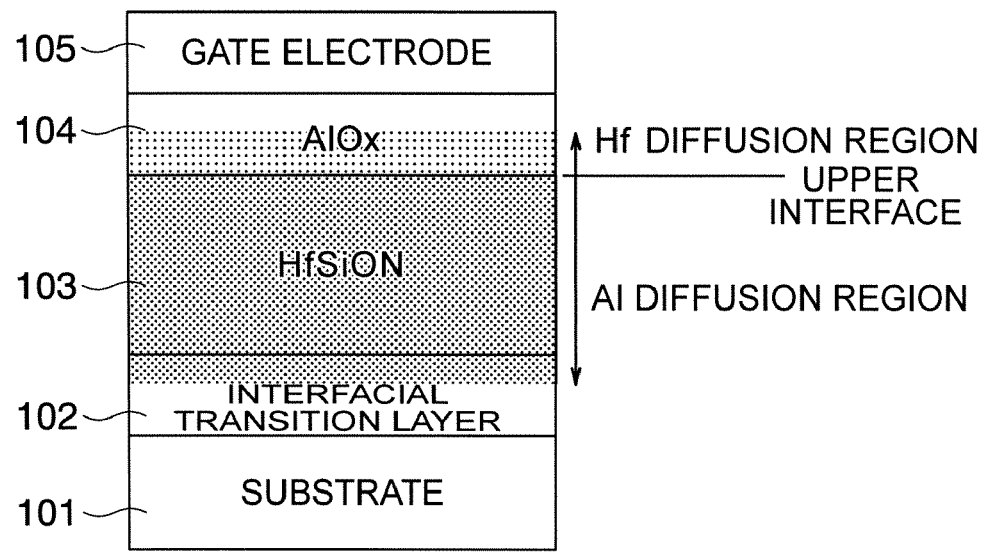
FIG. 31 is a cross-sectional view showing the Al and Hf diffusion in a semiconductor device according to one embodiment of the present invention, where annealing is performed at 1000° C.

In the following, the movement of atoms during the heat treatment in the stacked structure of one embodiment of the present invention is summed up. When the stacked structure schematically shown in FIG. 1 is annealed at 800° C., Al atoms start diffusing from the AlOx film toward the HfSiON film, but do not reach the interfacial transition layer, as shown in FIG. 30. This was made clear by the SIMS test shown in FIG. 3. Also, Hf diffusion from the HfSiON film to the AlOx film is not observed at 800° C., as is apparent from FIG. 8. Accordingly, only the Al diffusion in the HfSiON film is observed at 800° C. The higher probability of the Al diffusion can be understood, because Al has a smaller atomic radius than Hf, and lower mass than Hf. When heat treatment is carried out at 1000° C., the Al diffusion from the AlOx film into the HfSiON film becomes more prominent, and reaches the interfacial transition layer. This causes a Vfb shift by 0.25 V in the positive direction. Meanwhile, the Hf diffusion from the HfSiON film into the AlOx film also becomes prominent at this temperature (see FIG. 8), and the diffused Hf increases the relative permittivity of the AlOx film. FIG. 31 shows a cross-sectional view of a stacked structure that is obtained by annealing the stacked structure of FIG. 1 at 1000° C. The Al diffusion in the HfSiON film is much faster than the Hf diffusion in the AlOx film. Accordingly, asymmetric atom diffusion regions are formed above and below the AlOx/HfSiON interface, as shown in FIG. 31.

There is a possibility that the same Hf diffusion as in the embodiment of the present invention might have occurred in conventional cases, but such a fact has not been reported. In principle, the possibility of such an event is rather low. By the method disclosed in U.S. Patent Application Publication No. 2005/0269635A1, an insulating film placed at the interface between a gate electrode and a high-k insulating film must contain nitrogen, and such an insulating film may be an AlN film or an AlON film, for example. Such an arrangement is made in order to stabilize the structure by virtue of nitrogen. However, it is assumed that, because of such an arrangement, Hf diffusion into an AlN film or the like becomes very unlikely to occur.

According to the method disclosed by H.-J. Li and M. I. Gardner in "Dual High-k Gate Dielectric with Poly Gate Electrode: HfSiON on nMOS and $Al_2O_3$ Capping layer on pMOS", IEEE EDL, p.p. 441-444, an $Al_2O_3$ layer is placed at the interface between a polysilicon film and a HfSiON film. However, it is assumed that Hf diffusion into the $Al_2O_3$ layer does not occur either in this structure. This is because a decrease in threshold voltage Vth is achieved by virtue of a FLP energy value that is unique to the interface between the polysilicon film and the $Al_2O_3$ layer, and this is based on the assumption that the $Al_2O_3$ layer remains intact, as disclosed by H.-J. Li and M. I. Gardner in "Dual High-k Gate Dielectric with Poly Gate Electrode: HfSiON on nMOS and $Al_2O_3$ Capping layer on pMOS", IEEE EDL, p.p. 441-444. To support this theory, the thickness of the HfSiON film of the p-channel MIS transistor having the $Al_2O_3$ layer added thereto is reduced in an attempt to reduce the total thickness of the gate insulating film, as disclosed by H.-J. Li and M. I. Gardner in "Dual High-k Gate Dielectric with Poly Gate Electrode: HfSiON on nMOS and $Al_2O_3$ Capping layer on pMOS", IEEE EDL, p.p. 441-444. Otherwise, the total thickness of the gate insulating film becomes larger, due to the existence of the $Al_2O_3$ layer having a low relative permittivity.

In the structure disclosed by H.-J. Li and M. I. Gardner in "Dual High-k Gate Dielectric with Poly Gate Electrode: HfSiON on nMOS and $Al_2O_3$ Capping layer on PMOS", IEEE EDL, p.p. 441-444, heat treatment is carried out at 1000° C., but the phenomenon illustrated in FIG. 8 does not occur, the reason of which is not clear. However, in this reference, the ratio (=Hf/(Hf+Si)) in the HfSiON film is 80%, and HfSiON crystallizes at 1000° C., as shown in FIG. 6. Once the $HfO_2$ crystals are formed, the Hf atoms are stabilized in terms of energy. Accordingly, it is assumed that thermal diffusion into the $Al_2O_3$ layer becomes unlikely to occur.

According to one embodiments of the present invention, where a layer formed with an Al oxide is inserted to the interface between a gate electrode and a HfSiON film, this layer should preferably contain only Al and oxygen. If this layer contains N, Hf diffusion becomes unlikely to occur. The film thickness of the layer formed with the Al oxide should preferably be in the range of 0.3 nm to 2 nm. If the layer is thinner than 0.3 nm, the AlOx film becomes two-dimensionally discontinuous, and portions at which AlOx is not formed are inevitably formed. As a result, a shift of the flat-band voltage Vfb by virtue of Al diffusion becomes difficult to achieve. If the layer is thicker than 2 nm, Hf atoms are not diffused in a wide enough area, and the film thickness properties required for the gate insulating film of a future CMOS transistor cannot be obtained due to the Al oxide having a low relative permittivity.

One embodiment of the present invention can provide a semiconductor device that includes a CMOS device having a low threshold voltage Vth, with a metal gate and a gate insulating film made of a hafnium-based high-k material being combined. In this CMOS device, the above described positive shift of the flat-band voltage Vfb by virtue of diffused Al, or the positive shift of the flat-band voltage Vfb by virtue of an AlOx layer containing a large amount of Hf in some cases, is suitably combined with the original work function of the gate electrode.

First Embodiment

Figure 9:
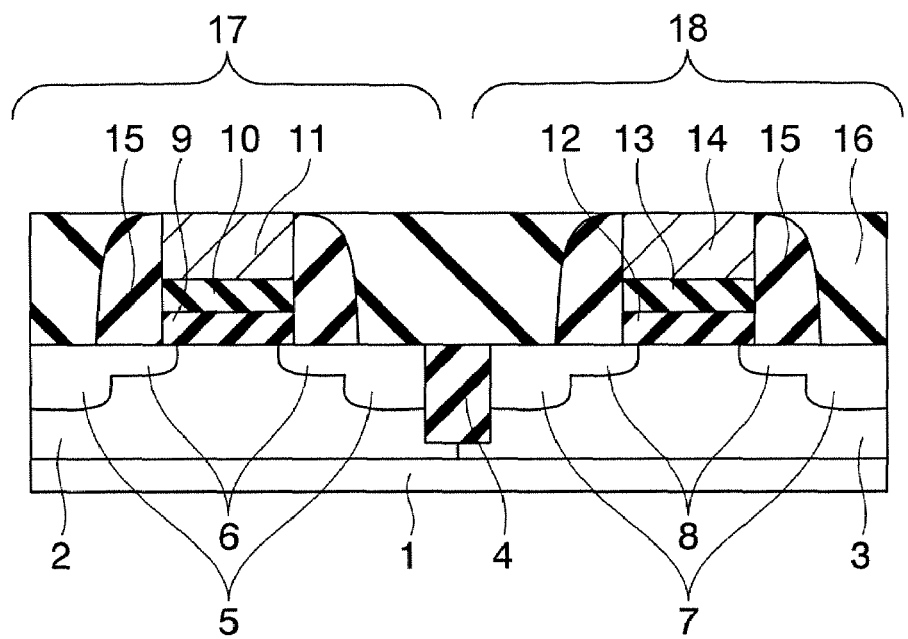
FIG. 9 is a cross-sectional view of a CMOSFET in accordance with a first embodiment.

A semiconductor device in accordance with a first embodiment of the present invention is described. The semiconductor device of this embodiment is a CMOS transistor. FIG. 9 shows a cross section of the CMOS transistor in the gate length direction.

As shown in FIG. 9, an n-type well region (an n-type semiconductor layer) 2 and a p-type well region (a p-type semiconductor layer) 3 are formed on a semiconductor substrate 1. The n-type well region 2 and the p-type well region 3 are isolated from each other by a device isolation layer 4 of a STI (Shallow Trench Isolation) structure.

A p-channel MIS transistor 17 is provided in the n-type well region 2. The p-channel MIS transistor 17 includes p-type diffusion layers 5, p-type extension layers 6, an interfacial transition layer 9, a HfSiON layer 10, and a gate electrode layer 11. The interfacial transition layer 9 is placed on the n-type well region 2, the HfSiON layer 10 is placed on the interfacial transition layer 9, and the gate electrode layer 11 is placed on the HfSiON layer 10. In this embodiment, sidewalls 15 made of an insulating material are provided on either side of the stacked structure formed with the interfacial transition layer 9, the HfSiON layer 10, and the gate electrode layer 11.

The p-type extension layers 6 are placed in the n-type well region 2 on either side of the stacked structure formed with the interfacial transition layer 9, the HfSiON layer 10, and the gate electrode layer 11. The p-type diffusion layers 5 are placed in the n-type well region 2 on either side of the sidewalls 15. The p-type diffusion layers 5 are designed to have a greater junction depth than the p-type extension layers 6 with respect to the n-type well region 2. The p-type diffusion layers 5 and the p-type extension layers 6 serve as the source/drain regions of the p-channel MIS transistor 17.

An n-channel MIS transistor 18 is provided in the p-type well region 3. The n-channel MIS transistor 18 includes n-type diffusion layers 7, n-type extension layers 8, an interfacial transition layer 12, a HfSiON layer 13, and a gate electrode layer 14. The interfacial transition layer 12 is placed on the p-type well region 3, the HfSiON layer 13 is placed on the interfacial transition layer 12, and the gate electrode layer 14 is placed on the HfSiON layer 13. In this embodiment, sidewalls 15 made of an insulating material are provided on either side of the stacked structure formed with the interfacial transition layer 12, the HfSiON layer 13, and the gate electrode layer 14.

The n-type extension layers 8 are placed in the p-type well region 3 on either side of the stacked structure formed with the interfacial transition layer 12, the HfSiON layer 13, and the gate electrode layer 14. The n-type diffusion layers 7 are placed in the p-type well region 3 on either side of the sidewalls 15. The n-type diffusion layers 7 are designed to have a greater junction depth than the n-type extension layers 8 with respect to the p-type well region 3. The n-type diffusion layers 7 and the n-type extension layers 8 serve as the source/drain regions of the n-channel MIS transistor 18.

The p-channel MIS transistor 17 and the n-channel MIS transistor 18 are covered with an interlayer insulating layer 16.

In the first embodiment, aluminum is distributed at least in the interface between the interfacial transition layer 9 and the HfSiON layer 10 that constitute the p-channel MIS transistor 17.

The gate electrode 11 contains nickel silicide as a base having a high-nickel composition, and may be formed with cubic $Ni_3Si$ or hexagonal $Ni_{31}Si_{12}$. The gate electrode 14 contains nickel silicide as a base having a high-silicon composition as a base, and may be formed with cubic $NiSi_2$. The composition ratio between nickel and silicon (nickel/silicon) in the gate electrode 11 of the p-channel MIS transistor 17 should preferably be 31/12 or higher, and the composition ratio between nickel and silicon (nickel/silicon) in the gate electrode 14 of the n-channel MIS transistor 18 should preferably be 0.5 or lower.

The n-type well region 2 and the p-type well region 3 are formed with a Si or Ge semiconductor.

Next, a method for manufacturing the semiconductor device of the first embodiment is described. In this manufacturing method, the semiconductor substrate is a silicon substrate. FIGS. 10 through 15 illustrate the procedures for manufacturing the semiconductor device of the first embodiment.

First, the n-type well region 2 and the p-type well region 3 isolated from each other by the device isolation layer 4 of a STI structure are formed on the silicon substrate 1. A silicon wafer is oxidized through a dry process or a wet process, so as to form an extremely thin (approximately 0.6 nm in this embodiment) oxide film that serves as an interfacial transition layer 19. A HfSiON layer 20 is then formed on the entire wafer. Here, a HfSiON layer 20 of 3 nm in thickness is deposited by MOCVD (Metal Organic Chemical Vapor Deposition), for example. In this HfSiON layer 20, the ratio (=Hf/(Hf+Si)) is 50%, and the nitrogen concentration is 20 atomic %. The deposition method employed here may be ALD (Atomic Layer Deposition), MBE (Molecular Beam Epitaxy), PVD (Physical Vapor Deposition), or the like.

Figure 10:
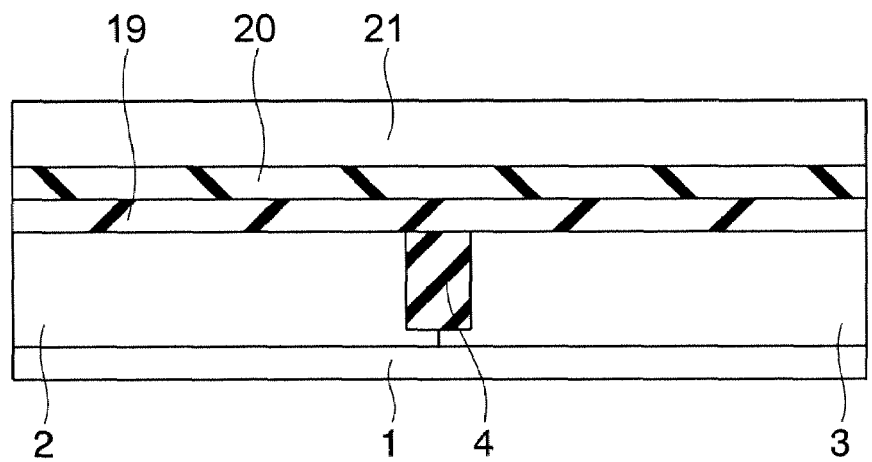
FIGS. 10 through 15 are cross-sectional views showing a procedure for manufacturing the semiconductor device in accordance with the first embodiment.

By another technique for forming the interfacial transition layer 19, the formation of the HfSiON layer 20 may be carried out on a silicon wafer having a surface natural oxide film removed therefrom. In such a case, the silicon substrate 1 is oxidized to form the interfacial transition layer 19 during the formation of the HfSiON film, and the HfSiON layer 20 is then formed. An undoped silicon layer 21 of 50 nm in film thickness is then deposited on the entire wafer by the conventional CVD in this embodiment. Thus, the structure shown in FIG. 10 is completed.

Figure 11:
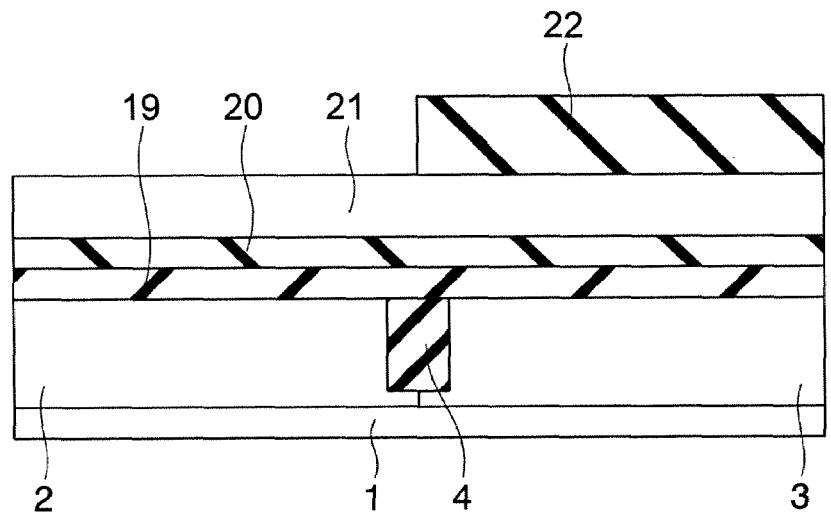
Figure 12:
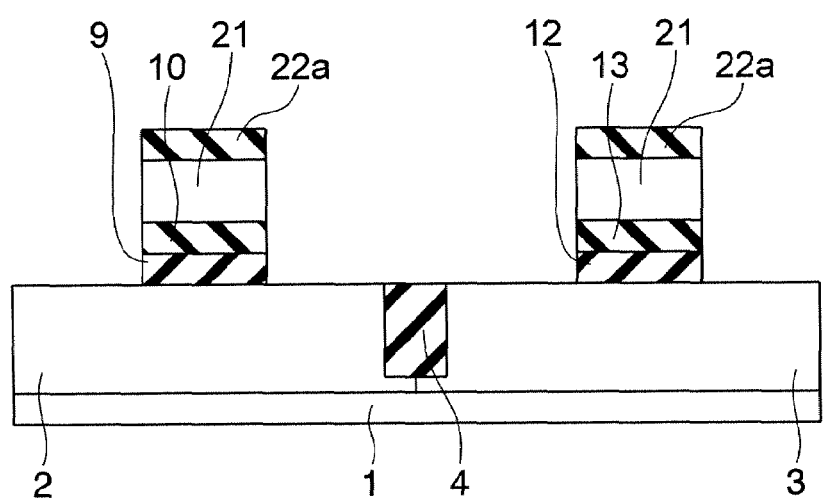

Next, as shown in FIG. 11, a mask layer 22 made of SiN, for example, is formed only above the p-type well region 3 by a regular lithography technique and an etching technique. Al ions are then implanted into this structure. The ion implantation in this embodiment is carried out with an acceleration energy of 10 keV and a dose amount of $10^{16}$ cm$^2$. Under such conditions, the Al ions are distributed inside the undoped silicon layer 21 of 50 nm in thickness above the n-type well region 2. After the mask layer 22 made of SiN is removed with phosphoric acid, this structure is subjected to heat treatment. Through this heat treatment, the Al ions implanted into the undoped silicon layer 21 above the n-type well region 2 diffuse in the depth direction (toward the substrate), so that the Al element reaches the vicinity of the interface between the interfacial transition layer 19 and the HfSiON layer 20. The heat treatment here is carried out at 1000° C. for approximately one minute.

Since Al is a material that does not silicide-reacts with Si, Al diffusion is easily caused. Therefore, Si is desirable as an implantation receiving material where Al ions are implanted and diffused in an embodiment of the present invention.

A mask layer 22a formed with a SiN layer, for example, is then formed on the entire surface of the silicon wafer, and a resist pattern (not shown) having the shapes of gate electrodes is formed above the n-type well region 2 and the p-type well region 3. The mask layer 22a, the undoped silicon layer 21, the HfSiON layer 20, and the interfacial transition layer 19 are collectively processed, to form the structure shown in FIG. 12.

Figure 13:
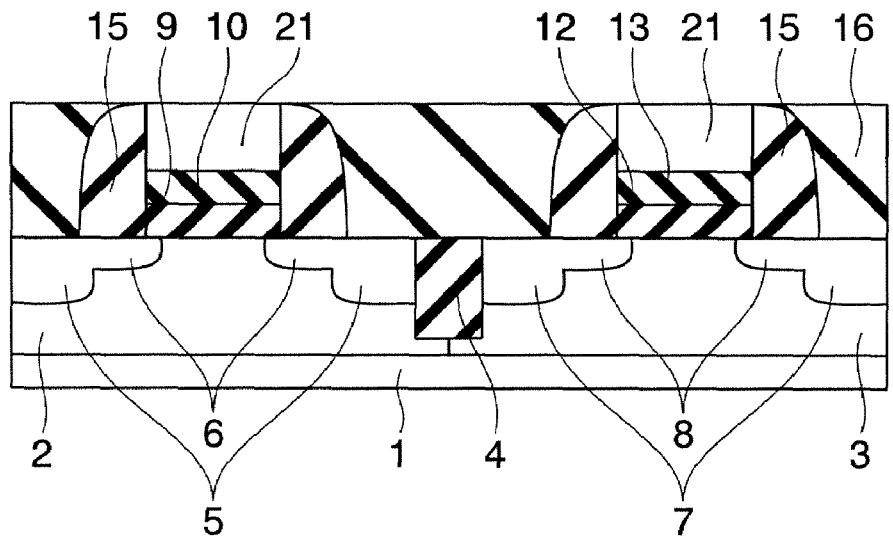

The regular extension regions 6 and 8 are then formed, the sidewalls 15 are formed, the diffusion layers 5 and 7 are formed, the interlayer insulating film 16 is formed, and polishing for flattening such as CMP (Chemical Mechanical Polishing) is performed, so as to obtain the structure shown in FIG. 13.

The series of manufacturing procedures of this embodiment is characterized in that no impurities are added to the undoped silicon layer 21 in both channel transistors. By a conventional silicon gate technique, ion implantation is also carried out on the gate electrodes when the ion implantation for forming the extension or diffusion layers is carried out. In this embodiment, however, the mask layer 22a is formed on the silicon gate at the time of ion implantation, so as to prevent the ion implantation into the gate electrodes. This is to prevent the implanted impurities from hindering a metal silicide reaction of the silicon gate that will be performed later, and to prevent the implanted impurities from hindering the formation of uniform metal silicide layers in both channel transistors.

Next, a buffer layer 23, a Ni layer 24, and a Ni diffusion barrier layer 25 are stacked only above the p-type well region 3 in the structure shown in FIG. 13. The buffer layer 23 is a metal layer made of Ti, Zr, Hf, or the like. In this embodiment, the buffer layer 23 is formed by depositing Ti, and has a thickness of 4 nm. The thickness of the Ni layer 24 is 15 nm. The Ni diffusion barrier layer 25 is a metal layer made of W, for example. The film thickness of the Ni diffusion barrier layer 25 of this embodiment is 25 nm. Through the above manufacturing procedures, the structure shown in FIG. 14 is obtained.

Figure 14:
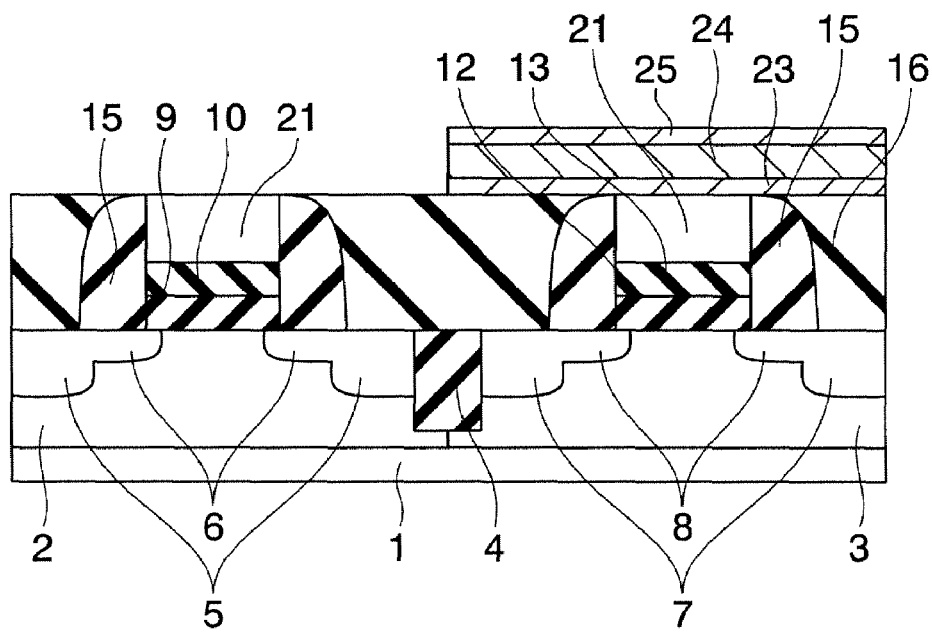
Figure 15:
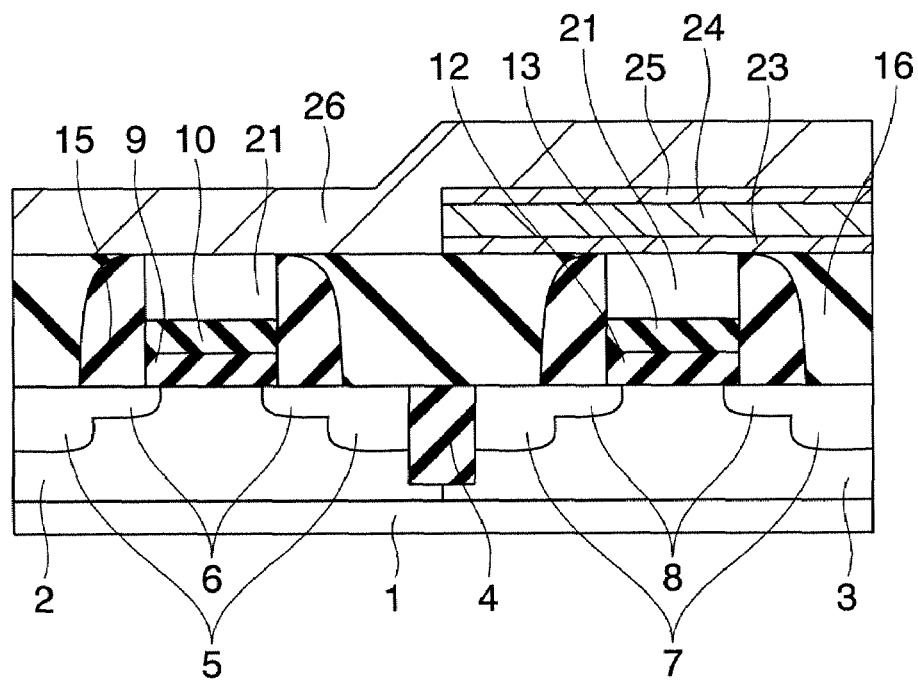

A Ni layer 26 of 100 nm in film thickness is deposited on the entire surface of the structure shown in FIG. 14 by a sputtering technique, and the structure shown in FIG. 15 is obtained.

The structure shown in FIG. 15 is subjected to a heat treatment at a temperature from 400° C. to 500° C., for example, at 450° C. for one minute. By doing so, the undoped silicon layer 21 is structurally turned into nickel silicide. Here, the formation of the nickel silicide above the n-type well region 2 differs from the formation of the nickel silicide above the p-type well region 3, and the phase of the resultant nickel silicide above the n-type well region 2 differs from the phase of the resultant nickel silicide above the p-type well region 3. Above the n-type well region 2, the undoped silicon layer 21 of 50 nm in thickness reacts directly with the Ni layer 26 of 100 nm in thickness, and $Ni_3Si$, $Ni_{31}Si_{12}$, or the like, which is the initial nucleation phase at 400° C. to 500° C., precipitates and grows. The Ni layer 26 is designed to be sufficiently thicker than the undoped silicon layer 21, so that $Ni_3Si$ or $Ni_{31}Sil_{12}$ is formed in contact with the HfSiON layer 10.

Above the p-type well region 3, the undoped silicon layer 21 of 50 nm in thickness and the Ni layer 24 of 15 nm in thickness react with each other, with the Ti layer 23 being interposed in between. Here, the Ti layer 23 serves as a buffer layer against the diffusion of Ni atoms, and reduces the Ni flux in the undoped silicon layer 21. Accordingly, a $NiSi_2$ layer as a silicon-rich phase at the reaction front of the silicide reaction nucleates and grows. Through this process, a $NiSi_2$ layer that normally cannot be formed at a temperature lower than 650° C. can be formed at a temperature as low as 400° C. to 500° C. The film thickness ratio between the nickel layer 24 and the undoped silicon layer 21 above the p-type well region 3 is adjusted to a value between 5/18 and 1/2, so that $NiSi_2$ is formed in contact with the HfSiON layer 13. If the ratio is equal to or lower than 5/18, the undoped silicon layer 21 remains unconsumed. If the ratio is equal to or higher than 1/2, a phase transition to the Ni-rich silicide layer that is more stable in terms of thermodynamics than $NiSi_2$ in this temperature range is caused.

The Ni diffusion barrier layer 25 serves to stop the downward diffusion of the nickel layer 26 located on the Ni diffusion barrier layer 25. Although W is mentioned above as an example, the Ni diffusion barrier layer 25 may be made of any material, as long as it can prevent the Ni atom diffusion from the Ni layer 26 located above during the heat treatment at 400° C. to 500° C. The film thickness of the Ni diffusion barrier layer 25 is also adjusted so as to fulfill the function. Other than W, titanium nitride, tantalum nitride, titanium nitride silicide, tantalum nitride silicide, tantalum aluminum nitride, or the like, is excellent as a diffusion barrier layer.

The effects of this embodiment are not greatly affected if a small amount of some other metal element is contained in the nickel silicide, for example, if 5% of Pt at a metal rate is contained so as to increase the structural heat resistance of the silicide.

Next, the unreacted portions of the Ni layer 24 and the Ti buffer layer 23 are selectively removed from the nickel silicide by sulfuric acid. A flattening process is again carried out, so as to obtain the structure shown in FIG. 9.

In this embodiment, the gate electrode 11 of the p-channel MIS transistor 17 is formed with a nickel-rich silicide such as $Ni_3Si$ or $Ni_{31}Si_{12}$. Such a silicide has a work function of approximately 4.85 eV. In addition to that, aluminum is distributed at the interface between the HfSiON layer 10 and the interfacial transition layer 9, as described above. Accordingly, the flat-band voltage Vfb shifts in the positive direction by approximately 0.25 V, and the apparent work function becomes approximately 5.10 eV. Since the work function of the $p^+$-poly used in the p-channel MIS transistor according to the conventional poly-Si gate technique is approximately 5.20 eV, the threshold voltage Vth of the p-channel MIS transistor 17 of this embodiment is higher than that of a poly-Si gate only by approximately 0.1 V. Meanwhile, the n-channel MIS transistor 18 is formed with $NiSi_2$, the effective work function of the gate electrode 14 above a HfSiON gate insulating film is approximately 4.3 eV. Since the work function of the $n^+$-poly used in the n-channel MIS transistor according to the conventional poly-Si gate technique is approximately 4.05 eV, the threshold voltage Vth of the n-channel MIS transistor 18 of this embodiment is higher than that of a poly-Si gate only by approximately 0.25 V.

As described above, in a gate stack containing the nickel silicide/HfSiON of this embodiment, the threshold voltage Vth of either transistor becomes slightly higher than that of a poly-Si gate. Accordingly, the threshold value can be adjusted to an ideal value by optimizing the channel impurity concentration.

In accordance with this embodiment, a combination of FUSI and a high-k material can be used together with an appropriate threshold voltage Vth. In this manner, the first embodiment can provide a CMOS device that has high-performance gate electrodes with low resistance and high heat resistance, without the problem of depletion and impurity diffusion or penetration. Such a CMOS device has less current leakage of the gate insulating film.

Second Embodiment

Figure 16:
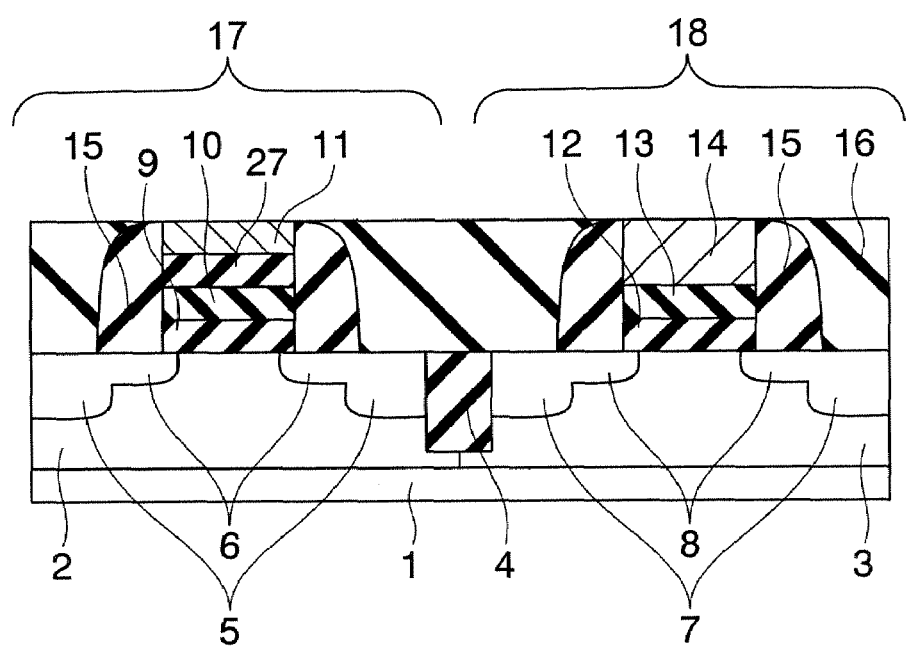
FIG. 16 is a cross-sectional view of a CMOSFET in accordance with a second embodiment.
Figure 17:
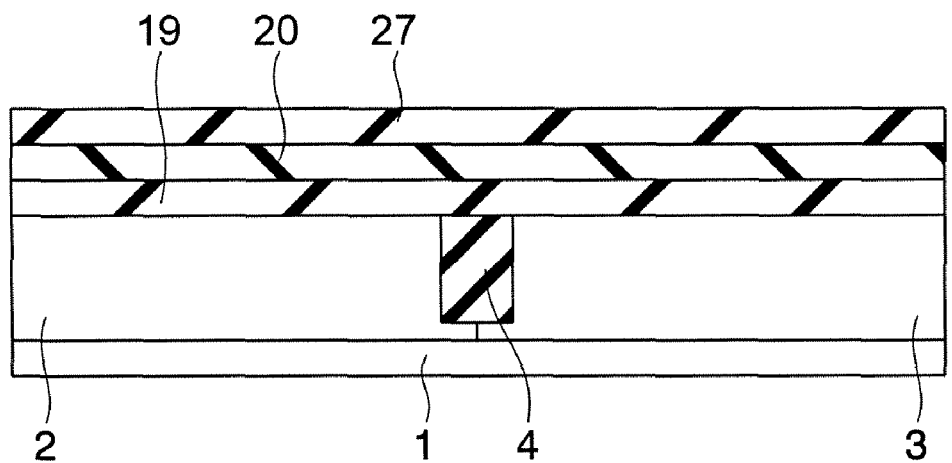
FIGS. 17 through 22 are cross-sectional views showing a procedure for manufacturing the semiconductor device in accordance with the second embodiment.

Next, a semiconductor device in accordance with a second embodiment of the present invention is described. The semiconductor device of this embodiment is a CMOS transistor. FIG. 16 shows a cross section of the CMOS transistor in the gate length direction.

The CMOS transistor of this embodiment has the same structure as the CMOS transistor of the first embodiment shown in FIG. 9, except that an AlOx layer 27 is provided between the HfSiON layer 10 and the gate electrode 11 of the p-channel MIS transistor 17. As the AlOx layer 27 is added, Al atoms diffuse from the AlOx layer 27 into the HfSiON layer 10, while Hf atoms diffuse from the HfSiON layer 10 into the AlOx layer 27. As a result of the interdiffusion in this embodiment, at least in both regions of 0.3 nm from the interface between the AlOx layer 27 and the HfSiON layer 10, the aluminum concentration on the side of the HfSiON layer 10 is in the range of $1 \times 10^{22}$ $cm^{-3}$ to $3 \times 10^{22}$ $cm^{-3}$, and the hafnium concentration on the side of the AlOx layer 27 is in the range of $1 \times 10^{22}$ $cm^{-3}$ to $3 \times 10^{22}$ $cm^{-3}$. The other aspects of the structure of this embodiment are the same as those of the first embodiment.

Since the AlOx layer 27 exists in the p-channel MIS transistor 17 in the second embodiment, the flat-band voltage Vfb shifts in the positive direction by 0.1 V, by virtue of the dipole at the interface between the HfSiON layer 10 and the AlOx layer 27, and the apparent work function of the gate electrode 11 formed with a nickel-rich silicide or the like becomes approximately 5.2 eV, which is higher than in the first embodiment. This is a value equivalent to the work function of a conventional $p^+$-poly gate. Accordingly, this embodiment is advantageous in that no special measures need to be taken to adjust the threshold voltage Vth of the p-channel MIS transistor. The structure of the n-channel MIS transistor 18 is the same as that of the first embodiment, and the effects are also the same as those of the first embodiment.

Next, a method for manufacturing the semiconductor device of the second embodiment is described.

FIGS. 17 through 22 illustrate the procedures for manufacturing the semiconductor device of this embodiment.

As in the first embodiment, the n-type well region 2 and the p-type well region 3 isolated from each other by the device isolation layer 4 of a STI structure are formed on the semiconductor substrate 1. After that, an interfacial transition layer 19 and a HfSiON layer 20 are formed on the entire wafer surface. In this embodiment, the AlOx layer 27 is further formed on the entire wafer surface. The AlOx layer 27 may be formed by CVD, ALD, sputtering, or the like. In this embodiment, the AlOx layer 27 of 1 nm in film thickness is deposited by ALD, so as to obtain the structure shown in FIG. 17.

Figure 18:
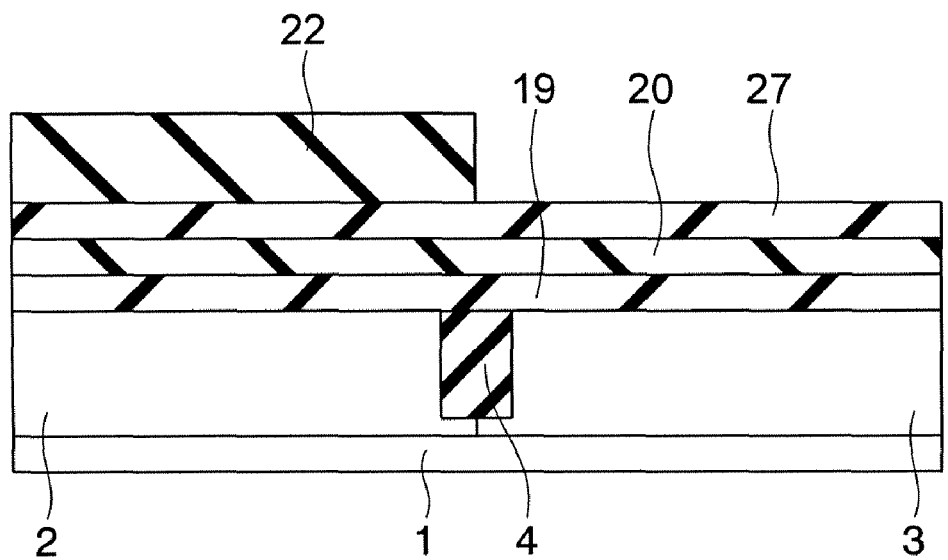

A mask layer 22 is then formed only above the n-type well region 2, so as to obtain the structure shown in FIG. 18.

Figure 19:
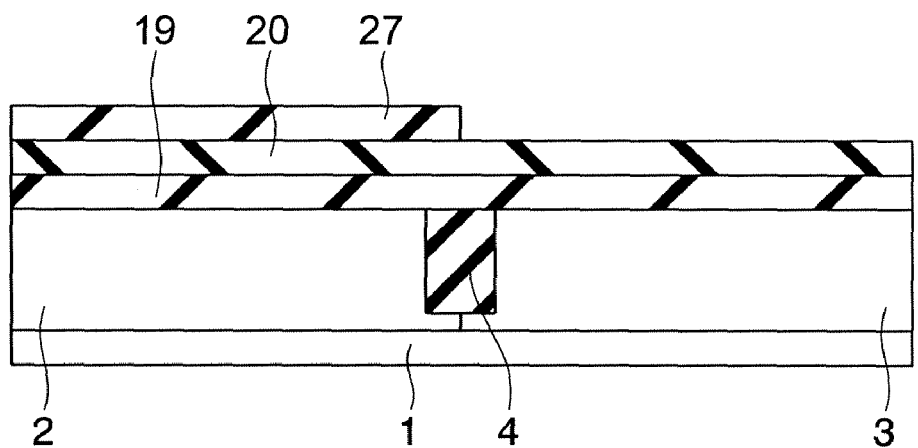

The portion of the AlOx layer 27 not covered with the mask layer 22 is then removed by wet etching. The mask layer 22 is then removed, and heat treatment is carried out to diffuse Al. The heat treatment is carried out at 1000° C. for 30 seconds. Through this heat treatment, Al thermally diffuses from the AlOx layer 27 into the interface between the HfSiON layer 20 and the interfacial transition layer 19 only above the n-type well region 2, and forms negative fixed charges. In this manner, the structure shown in FIG. 19 is obtained.

Figure 20:
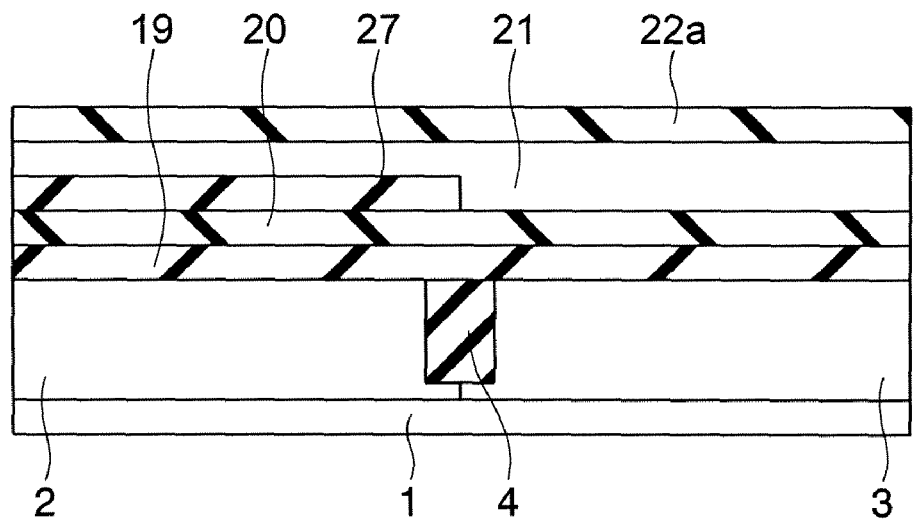

After that, a polysilicon layer 21 and a mask layer 22a are deposited on the entire wafer surface by CVD or the like, so as to obtain the structure shown in FIG. 20.

Figure 21:
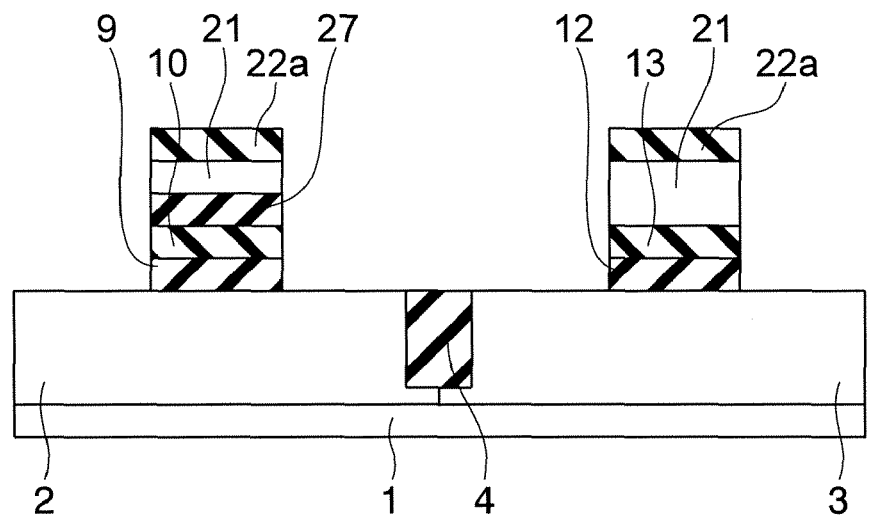

A resist pattern (not shown) having the shapes of gate electrodes is formed above the n-type well region 2 and the p-type well region 3 through a conventional process. The mask layer 22a, the undoped silicon layer 21, the AlOx layer 27, the HfSiON layer 20, and the interfacial transition layer 19 are collectively processed by a conventional etching technique. Here, the AlOx layer 27 exists only above the n-type well region 2. However, since the AlOx layer 27 is extremely thin, there is not an etching time lag between the p-channel MIS transistor 17 and the n-channel MIS transistor 18. Through the above procedures, the structure shown in FIG. 21 is obtained.

Figure 22:
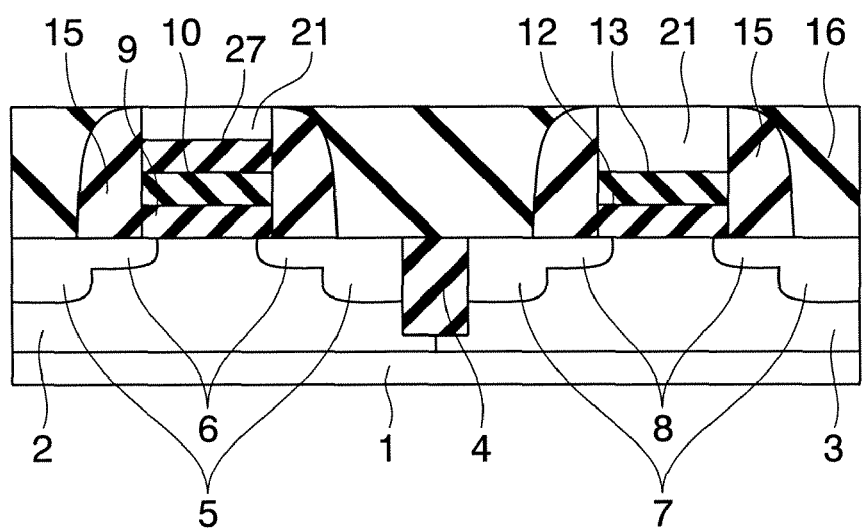

The regular extension regions 6 and 8 are then formed, the sidewalls 15 are formed, the diffusion layers 5 and 7 are formed, the interlayer insulating film 16 is formed, and polishing for flattening (CMP, for example) is performed, so as to obtain the structure shown in FIG. 22.

As in the first embodiment, the procedure for producing different nickel suicide phases is carried out, and the unreacted portions of the Ni and Ti buffer layers are selectively removed from the nickel suicide by sulfuric acid. A flattening process is again carried out, so as to obtain the structure shown in FIG. 16. In accordance with the second embodiment, there is no need to carry out the procedure for thinning only the HfSiON film of the p-channel MIS transistor as in the conventional case, and a device can be produced through a realistic process.

Third Embodiment

Figure 23:
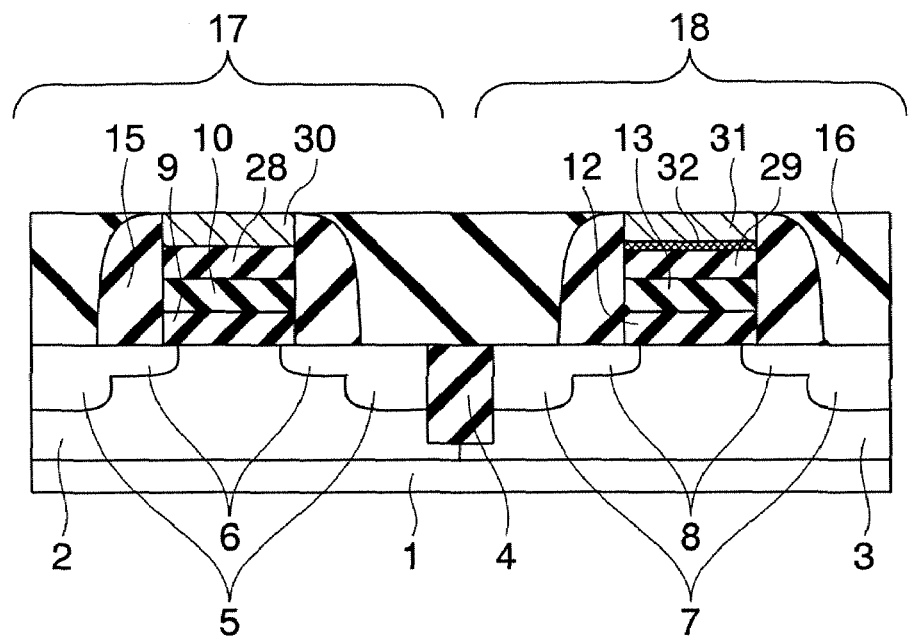
FIG. 23 is a cross-sectional view of a CMOSFET in accordance with a third embodiment.

Referring now to FIG. 23, a semiconductor device of a third embodiment of the present invention is described. The semiconductor device of this embodiment is a CMOS transistor that differs from the CMOS transistor of the first embodiment shown in FIG. 9 in the following aspects.

The p-channel MIS transistor 17 of this embodiment has an AlOx layer 28 between the HfSiON layer 10 and a gate electrode 30, and Al atoms are distributed at least in the vicinity of the interface between the HfSiON layer 10 and the interfacial transition layer 9 (or in the region including the interface). Also, the n-channel MIS transistor 18 has an AlOx layer 29 between the HfSiON layer 13 and a gate electrode 31, and Al atoms are distributed at least in the vicinity of the interface between the HfSiON layer 13 and the interfacial transition layer 12 (or in the region including the interface). Further, an impurity segregation layer 32 is formed at the interface between the AlOx 29 and the gate electrode 31 of the n-channel MIS transistor 18. The gate electrode 30 of the p-channel MIS transistor 17 is made of a material having a work function of 4.75 eV or greater, and the gate electrode 31 of the n-channel MIS transistor 18 is made of a material having a work function of 4.25 eV or smaller.

In the third embodiment, the p-channel MIS transistor and the n-channel MIS transistor have the AlOx layers 28 and 29, and Al atoms exist in the vicinity of the interface between the HfSiON layers and the interfacial transition layers (in the regions including the interfaces). Accordingly, a +0.35 V shift of the flat-band voltage Vfb constantly occurs. Since the gate electrode 30 of the p-channel MIS transistor 17 is made of a material having a work function of 4.75 eV or greater, the effective work function becomes 5.10 eV or greater, and the threshold voltage Vth of the p-channel MIS transistor 17 can be set lower. Meanwhile, the gate electrode 31 of the n-channel MIS transistor 18 is made of a material having a work function of 4.25 eV or smaller. While a +0.35 V shift of the flat-band voltage Vfb constantly occurs by virtue of the AlOx layer in this embodiment, the impurity segregation layer 32 is characteristically provided at the interface between the gate electrode 31 and the AlOx layer 29, so as to cancel the positive shift of the flat-band voltage Vfb in this embodiment. Since the impurity segregation layer 32 causes the flat-band voltage Vfb to shift in the negative direction by approximately 0.3 eV, the impurity segregation layer 32 can cancel the positive shift of the flat-band voltage caused by Al and make the apparent work function slightly smaller than the original work function of the metal material. More specifically, the effective work function of the n-channel MIS transistor 18 of this embodiment is 4.30 eV or smaller. In this embodiment, there is no need to provide an AlOx layer only in the p-channel MIS transistor 17 as in the second embodiment. Also, since the p-channel MIS transistor 17 and the n-channel MIS transistor 18 have the same gate insulating film structures, device integration can be easily achieved. Furthermore, in this embodiment, a metal or a compound containing the metal (other than a silicide) is employed, instead of metal suicides as in the first and second embodiments, the resistivity is low in principle, and the gate parasitic resistance is also low.

Next, a method for manufacturing the semiconductor device in accordance with the third embodiment is described.

Figure 24:
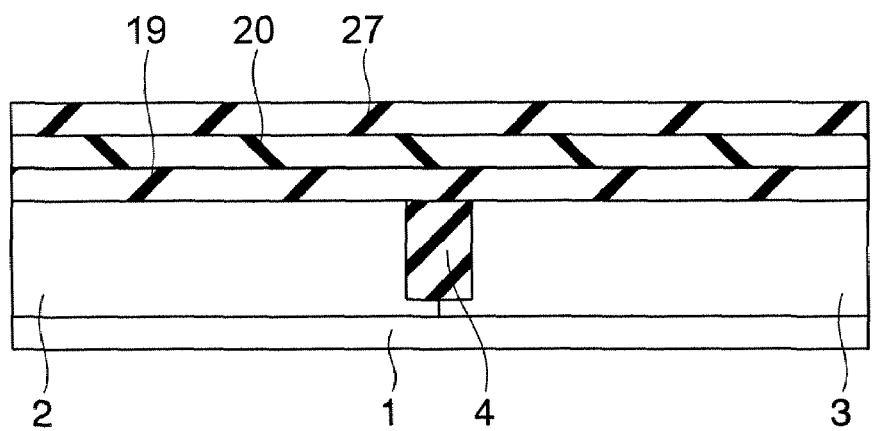
FIGS. 24 through 27 are cross-sectional views showing a procedure for manufacturing the semiconductor device in accordance with the third embodiment.

FIGS. 24 through 27 illustrate the procedures for manufacturing the semiconductor device of this embodiment. Through the same procedure as the procedure of the second embodiment illustrated in FIG. 17, the structure shown in FIG. 24 is obtained.

Figure 25:
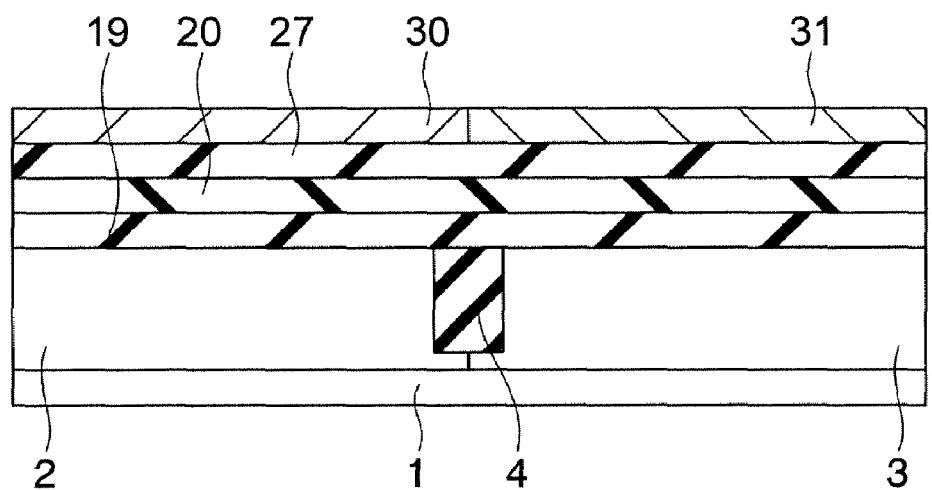
Figure 26:
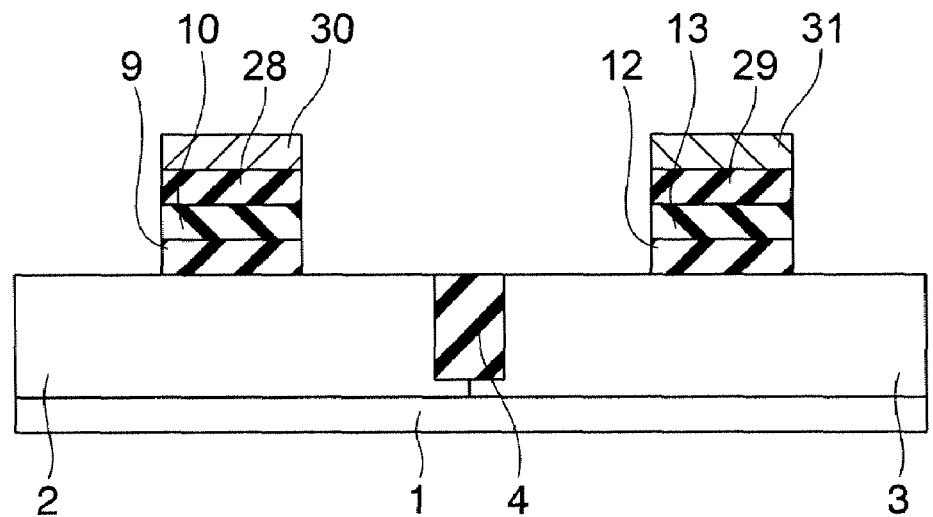
Figure 27:
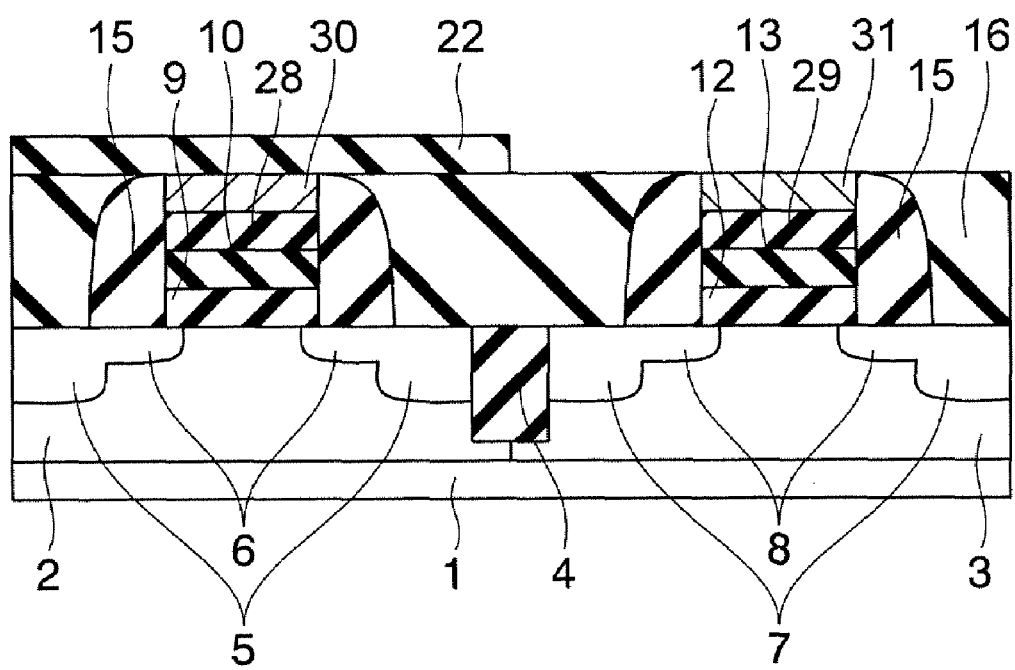

After that, a metal film 30 having a work function of 4.75 eV or greater is formed above the n-type well region 2, and a metal film 31 having a work function of 4.25 eV or smaller is formed above the p-type well region 3. In this embodiment, tantalum carbide having a work function of 4.8 eV is deposited to form the metal film 30 of 50 nm in thickness by a sputtering technique, and tantalum carbide having a work function of 4.2 eV is deposited to form the metal film 31 of 50 nm in thickness by a sputtering technique. Although the metal films 30 and 31 are both made of tantalum carbide, the work functions of the metal films 30 and 31 can be controlled by adjusting the orientations of the metal films 30 and 31. In order to achieve a large work function, the tantalum carbide film should have a TaC (111) orientation, and to achieve a small work function, the tantalum carbide film should have a TaC (200) orientation. Further, heat treatment is carried out to diffuse Al. The heat treatment is carried out at 1000° C. for 30 seconds. Through this heat treatment, Al thermally diffuses from the AlOx layer 27 into the interface between the HfSiON layer 20 and the interfacial transition layer 19, and forms negative fixed charges. In this manner, the structure shown in FIG. 25 is obtained.

A pattern (not shown) that is made of a resist and has the shapes of gate electrodes is formed above the n-type well region 2 and the p-type well region 3. With this pattern serving as a mask, the metal film 30, the metal film 31, the AlOx layer 27, the HfSiON layer 20, and the interfacial transition layer 19 are collectively processed. Since the same metal gate material (tantalum carbide) is employed in both the p-channel MIS transistor and the n-channel MIS transistor, the collective processing can be performed, and the number of manufacturing procedures is reduced accordingly. The resist pattern is then removed, to obtain the structure shown in FIG. 26. The TaC gate electrodes of this embodiment excel in oxidation resistance and chemical resistance, and hardly change their structures even when subjected to oxygen ashing normally used for the process of moving the resist or mixed solution treatment using sulfuric acid and hydrogen peroxide.

The regular extension regions 6 and 8 are then formed, the sidewalls 15 are formed, the diffusion layers 5 and 7 are formed, the interlayer insulating film 16 is formed, and polishing for flattening (CMP, for example) is performed. After those regular procedures, the mask layer 22 is formed only above the n-type well region 2, so as to obtain the structure shown in FIG. 27.

Ion implantation is then carried out on the portion not covered with the mask layer 22, using an n-type dopant element such as phosphorus or antimony. The acceleration energy of the ion implantation should be set so that the implanted ions stay within the gate electrode 31. The amount of ions to be implanted should be set at $1\times10^{15}$ cm$^{-2}$, so as to reduce the work function. After the ion implantation, heat treatment is carried out at 800° C. for one minute, so that the dopant element is segregated at the interface between the gate electrode 31 and the AlOx layer 29. As a result, a −0.4 eV shift of the flat-band voltage Vfb is caused. After that, the mask layer 22 is removed, and device flattening is performed, so as to complete the structure shown in FIG. 23.

Although the above described heat treatment is carried out at 800° C. for one minute, this is only one example set of conditions for achieving the effects of the present invention, and actual heat treatment is not limited to the conditions. In this structure, the dopant atoms should reach the interface between the metal gate and the AlOx layer. However, the metal gates of the present invention need to be made of a material that can endure the high-temperature processing (at 1000° C.) performed for diffusing Al. In view of this, the metal gates of the present invention need to have a high melting point, and, with the metal gates having a high melting point, the heat diffusion of the dopant requires a high temperature, typically, 800° C. or higher.

FIG. 28 collectively shows the effective work functions of the gate electrodes obtained in the structures of the first through third embodiments. In the second embodiment, the threshold voltage Vth of the p-channel MIS transistor can be made lower than in the first embodiment, but the AlOx layer needs to remain only in the p-channel MIS transistor. As a result, the manufacturing procedures become more complicated in the second embodiment.

The third embodiment utilizes the pure metal gate technique, and has an advantage in setting a low threshold voltage Vth for the n-channel MIS transistor among the embodiments of the present invention. Also, the metal gates of the third embodiment advantageously have a low resistivity. Like the first embodiment, the third embodiment also has a great advantage in integration, having no need to produce different gate insulating films for the p-channel MIS transistor and the n-channel MIS transistor. However, unlike the FUSI technique, the pure metal gate technique does not have compatibility with the conventional art.

As described above, each of the embodiments of the present invention can provide a MIS transistor having a stacked structure formed with a metal gate with an appropriate threshold voltage Vth and a gate insulating film made of a hafnium-based high-k material.

In the first through third embodiments, presently-available flat-type transistors are employed. However, the essence of the present invention lies in the gate electrode/gate insulating film stacked structure in a CMOS transistor, and therefore, the shapes of transistors are not limited. The present invention can be applied not only to flat-type transistors but also to three-dimensional transistors such as FIN transistors.

The present invention is not limited to the above described embodiments, and various changes can be made to those embodiments within the scope of the claimed invention. Also, various modifications may be made to those embodiments, without departing from the scope of the invention. Further, the components disclosed in the above embodiments may be combined to form various modes of the invention.

What is claimed is:

1. A semiconductor device comprising:
   a substrate:
   a p-channel MIS transistor including:
     an n-type semiconductor region formed on the substrate;
     a p-type source region and a p-type drain region formed to face each other in the n-type semiconductor region;
     a first insulating layer formed on the n-type semiconductor region between the p-type source region and the p-type drain region, and containing silicon and oxygen, the first insulating layer having a first region;
     a second insulating layer formed on the first insulating layer, and containing hafnium, silicon, oxygen, and nitrogen, the second insulating layer having a second region, the second region being in a 0.3 nm range in a film thickness direction from a interface between the first insulating layer and the second insulating layer, the first region being in a 0.3 nm range in a film thickness direction from the interface between the first insulating layer and the second insulating layer, and each of the first and second regions including aluminum atoms with a concentration of $1\times10^{20}$ cm$^{-3}$ or more to $1\times10^{22}$ cm$^{-3}$ or less; and
     a first gate electrode formed on the second insulating layer, and an n-channel MIS transistor including:
     a p-type semiconductor region formed on the substrate and insulated from the n-type semiconductor region;
     an n-type source region and an n-type drain region formed to face each other in the p-type semiconductor region;
     a third insulating layer formed on the p-type semiconductor region between the n-type source region and n-type drain region, and containing silicon and oxygen;
     a fourth insulating layer formed on the third insulating layer, and containing hafnium, silicon, oxygen, and nitrogen; and a second gate electrode formed above the fourth insulating layer.

2. The semiconductor device according to claim 1, wherein:
the first and second gate electrodes are made of a compound containing nickel and silicon;
a composition ratio of the number of nickel to the number of silicon in the first gate electrode is 31/12 or higher; and
a composition ratio of the number of nickel to the number of silicon in the second gate electrode is 0.5 or lower.

3. The semiconductor device according to claim 1, wherein the first gate electrode is formed with a material having a work function of 4.75 eV or more, and the second gate electrode is formed with a material having a work function of 4.25 eV or less.

4. The semiconductor device according to claim 1, wherein:
the first gate electrode is formed of tantalum carbide.

5. The semiconductor device according to claim 1, wherein:
the second gate electrode is formed of tantalum carbide.

6. The semiconductor device according to claim 1, wherein:
a composition ratio of a number of hafnium to a total number of hafnium and silicon in each of the second and fourth insulating layers is in the range of 25% or more to less than 80%; and
a concentration of nitrogen in each of the second and fourth insulating layers is 20 atomic % or less.

7. The semiconductor device according to claim 6, wherein:
the composition ratio is in the range of 50% or more to less than 80%.

8. A semiconductor device comprising:
a substrate:
a p-channel MIS transistor including:
an n-type semiconductor region formed on the substrate;
a p-type source region and a p-type drain region formed to face each other in the n-type semiconductor region;
a first insulating layer formed on the n-type semiconductor region between the p-type source region and the p-type drain region, and containing silicon and oxygen, the first insulating layer having a first region;
a second insulating layer formed on the first insulating layer, and containing hafnium, silicon, oxygen, and nitrogen, the second insulating layer having second and third regions, the second region being in a 0.3 nm range in a film thickness direction from an interface between the first insulating layer and the second insulating layer, the first region being in a 0.3 nm range in a film thickness direction from the interface between the first insulating layer and the second insulating layer, and each of the first and second regions including aluminum atoms with a concentration of $1 \times 10^{20}$ cm$^{-3}$ or more to $1 \times 10^{22}$ cm$^{-3}$ or less;
a third insulating layer formed on the second insulating layer, and containing aluminum and oxygen, the third insulating layer having a fourth region, the fourth region being in a 0.3 nm range in a film thickness direction from an interface between the second insulating layer and the third insulating layer, the third region being in a 0.3 nm range in a film thickness direction from the interface between the second insulating layer and the third insulating layer, and each of the third and fourth regions including aluminum atoms with a concentration of $1 \times 10^{22}$ cm$^{-3}$ or more to $3 \times 10^{22}$ cm$^{-3}$ or less; and
a first gate electrode formed on the third insulating layer, and an n-channel MIS transistor including:
a p-type semiconductor region formed on the substrate and insulated from the n-type semiconductor region;
an n-type source region and an n-type drain region formed to face each other in the p-type semiconductor region;
a fourth insulating layer formed on the p-type semiconductor region between the n-type source region and the n-type drain region, and containing silicon and oxygen;
a fifth insulating layer formed on the fourth insulating layer, and containing hafnium, silicon, oxygen, and nitrogen; and
a second gate electrode formed above the fifth insulating layer.

9. The semiconductor device according to claim 8, wherein:
the first and second gate electrodes are made of a compound containing nickel and silicon;
a composition ratio of a number of nickel to a number of silicon in the first gate electrode is 31/12 or higher; and
a composition ratio of a number of nickel to a number of silicon in the second gate electrode is 0.5 or lower.

10. The semiconductor device according to claim 8, wherein the first gate electrode is formed with a material having a work function of 4.75 eV or more, and the second gate electrode is formed with a material having a work function of 4.25 eV or less.

11. The semiconductor device according to claim 8, wherein:
the first gate electrode is formed of tantalum carbide.

12. The semiconductor device according to claim 8, wherein:
the second gate electrode is formed of tantalum carbide.

13. The semiconductor device according to claim 8, wherein:
a composition ratio of a number of hafnium to a total number of hafnium and silicon in each of the second and fifth insulating layers is in the range of 25% or more to less than 80%; and
a concentration of nitrogen in each of the second and fifth insulating layers is 20 atomic % or less.

14. The semiconductor device according to claim 13, wherein:
the composition ratio is in the range of 50% or more to less than 80%.

15. A semiconductor device comprising:
a substrate:
a p-channel MIS transistor including:
an n-type semiconductor region formed on the substrate;
a p-type source region and a p-type drain region formed to face each other in the n-type semiconductor region;
a first insulating layer formed on the n-type semiconductor region between the p-type source region and the p-type drain region, and containing silicon and oxygen, the first insulating layer having a first region;
a second insulating layer formed on the first insulating layer, and containing hafnium, silicon, oxygen, and nitrogen, the second insulating layer having a second and third regions, the second region being in a 0.3 nm range in a film thickness direction from a interface between the first insulating layer and the second insulating layer, the first region being in a 0.3 nm range in a film thickness direction from the interface between the first insulating layer and the second insulating layer, and each of the first and second regions including aluminum atoms with a concentration of $1 \times 10^{20}$ cm$^{-3}$ or more to $1 \times 10^{22}$ cm$^{-3}$ or less;

a third insulating layer formed on the second insulating layer, and containing aluminum and oxygen, the third insulating layer having a fourth region, the fourth region being in a 0.3 nm range in a film thickness direction from an interface between the second insulating layer and the third insulating layer, the third region being in a 0.3 nm range in a film thickness direction from the interface between the second insulating layer and the third insulating layer, and each of the third and fourth regions including aluminum atoms with a concentration of $1 \times 10^{22}$ cm$^{-3}$ or more to $3 \times 10^{22}$ cm$^{-3}$ or less; and a first gate electrode formed on the third insulating layer, and an n-channel MIS transistor including:

a p-type semiconductor region formed on the substrate and insulated from the n-type semiconductor region;

an n-type source region and an n-type drain region formed to face each other in the p-type semiconductor region;

a fourth insulating layer formed on the p-type semiconductor region between the n-type source region and the n-type drain region, and containing silicon and oxygen the fourth insulating layer having a fifth region;

a fifth insulating layer formed on the fourth insulating layer, and containing hafnium, silicon, oxygen, and nitrogen, the fifth insulating layer having a sixth and seventh regions, the sixth region being in a 0.3 nm range in a film thickness direction from an interface between the fourth insulating layer and the fifth insulating layer, the fifth region being in a 0.3 nm range in a film thickness direction from the interface between the fourth insulating layer and the fifth insulating layer, and each of the fifth and sixth regions including aluminum atoms with a concentration of $1 \times 10^{20}$ cm$^{-3}$ or more to $1 \times 10^{22}$ cm$^{-3}$ or less;

a sixth insulating layer formed on the fifth insulating layer, and containing aluminum and oxygen, the sixth insulating layer having an eighth region, the eighth region being in a 0.3 nm range in a film thickness direction from an interface between the fifth insulating layer and the sixth insulating layer, the seventh region being in a 0.3 nm range in a film thickness direction from the interface between the fifth insulating layer and the sixth insulating layer, and each of the seventh and eighth regions including aluminum atoms with a concentration of $1 \times 10^{22}$ cm$^{-3}$ or more to $3 \times 10^{22}$ cm$^{-3}$ or less; and a second gate electrode formed above the sixth insulating layer.

16. The semiconductor device according to claim 15, wherein the first gate electrode is formed with a material having a work function of 4.75 eV or more, and the second gate electrode is formed with a material having a work function of 4.25 eV or less.

17. The semiconductor device according to claim 15, wherein:

the first gate electrode is formed of tantalum carbide.

18. The semiconductor device according to claim 15, wherein:

the second gate electrode is formed of tantalum carbide.

19. The semiconductor device according to claim 15, wherein:

a composition ratio of a number of hafnium to a total number of hafnium and silicon in each of the second and fifth insulating layers is in the range of 25% or more to less than 80%; and a concentration of nitrogen in each of the second and fifth insulating layers is 20 atomic % or less.

20. The semiconductor device according to claim 19, wherein:

the composition ratio is in the range of 50% or more to less than 80%.

* * * * *